United States Patent
Yamazaki

(10) Patent No.: US 8,552,440 B2
(45) Date of Patent: Oct. 8, 2013

(54) LIGHTING DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 59 days.

(21) Appl. No.: 13/326,475

(22) Filed: Dec. 15, 2011

(65) Prior Publication Data

US 2012/0161166 A1 Jun. 28, 2012

(30) Foreign Application Priority Data

Dec. 24, 2010 (JP) ................................. 2010-288677

(51) Int. Cl.
*H01L 29/205* (2006.01)
*H01L 33/00* (2010.01)

(52) U.S. Cl.
USPC ................... 257/91; 257/E33.066; 257/88

(58) Field of Classification Search
USPC .......... 257/93, 91, 89, 88, E33.066; 313/500, 313/507, 491
See application file for complete search history.

(56) References Cited

U.S. PATENT DOCUMENTS

| | | | |
|---|---|---|---|
| 2,972,692 A | 2/1961 | William et al. | |
| 3,833,833 A | 9/1974 | Nelson | |
| 4,298,869 A | 11/1981 | Okuno | |
| 5,939,839 A | 8/1999 | Robel et al. | |
| 6,157,127 A | 12/2000 | Hosokawa et al. | |
| 6,335,713 B1 | 1/2002 | Imai | |
| 6,462,722 B1 | 10/2002 | Kimura et al. | |
| 6,522,315 B2 | 2/2003 | Ozawa et al. | |
| 6,693,296 B1 | 2/2004 | Tyan | |
| 6,717,358 B1 | 4/2004 | Liao et al. | |
| 6,747,639 B2 | 6/2004 | So | |
| 6,839,045 B2 | 1/2005 | Ozawa et al. | |
| 7,005,196 B1 | 2/2006 | Carter et al. | |
| 7,012,585 B2 | 3/2006 | Agostinelli et al. | |
| 7,068,418 B2 | 6/2006 | Kawase | |

(Continued)

FOREIGN PATENT DOCUMENTS

EP   0 597 226 A1   5/1994
EP   0 895 219 A1   2/1999

(Continued)

OTHER PUBLICATIONS

Translation of WO2012/045857, Krichhof et al, (Apr. 2012) 11 pages.*

(Continued)

*Primary Examiner* — Caridad Everhart
(74) *Attorney, Agent, or Firm* — Eric J. Robinson; Robinson Intellectual Property Law Office, P.C.

(57) ABSTRACT

For integration of light-emitting elements and for suppression of a voltage drop, plural stages of light-emitting element units provided over a substrate having an insulating surface and each including a plurality of light-emitting elements which is connected in parallel are connected in series. Further, besides a lead wiring with a large thickness, a plurality of auxiliary wirings with different widths and different thicknesses is used, and the arrangement of the wirings, electrodes of the light-emitting elements, and the like is optimized. Note that in the lighting device, light emitted from the light-emitting element passes through the substrate having an insulating surface and then is extracted.

15 Claims, 13 Drawing Sheets

(56) References Cited

U.S. PATENT DOCUMENTS

| | | |
|---|---|---|
| 7,148,632 B2 | 12/2006 | Berman et al. |
| 7,180,483 B2 | 2/2007 | Kimura et al. |
| 7,199,516 B2 | 4/2007 | Seo et al. |
| 7,221,339 B2 | 5/2007 | Ozawa et al. |
| 7,253,793 B2 | 8/2007 | Ozawa et al. |
| 7,255,939 B2 | 8/2007 | Carter et al. |
| 7,271,785 B2 | 9/2007 | Jang |
| 7,285,801 B2 | 10/2007 | Eliashevich et al. |
| 7,322,718 B2 | 1/2008 | Setomoto et al. |
| 7,468,580 B2 | 12/2008 | Kawase |
| 7,710,364 B2 | 5/2010 | Ozawa et al. |
| 7,999,463 B2 | 8/2011 | Nomura |
| 2002/0196206 A1 | 12/2002 | Kimura et al. |
| 2003/0048072 A1 | 3/2003 | Ishihara et al. |
| 2003/0098827 A1 | 5/2003 | Ozawa et al. |
| 2003/0117348 A1 | 6/2003 | Knapp et al. |
| 2003/0122805 A1 | 7/2003 | So |
| 2003/0141807 A1 | 7/2003 | Kawase |
| 2003/0151360 A1 | 8/2003 | Fukunaga et al. |
| 2003/0170491 A1 | 9/2003 | Liao et al. |
| 2003/0189401 A1 | 10/2003 | Kido et al. |
| 2003/0227253 A1 | 12/2003 | Seo et al. |
| 2003/0231273 A1 | 12/2003 | Kimura et al. |
| 2004/0021425 A1 | 2/2004 | Foust et al. |
| 2004/0031957 A1 | 2/2004 | Tyan |
| 2004/0032220 A1 | 2/2004 | Cok et al. |
| 2004/0150591 A1 | 8/2004 | Ozawa et al. |
| 2005/0077838 A1 | 4/2005 | Blumel |
| 2005/0174064 A1 | 8/2005 | Agostinelli et al. |
| 2005/0218791 A1 | 10/2005 | Kawase |
| 2005/0225973 A1 | 10/2005 | Eliashevich et al. |
| 2006/0119253 A1 | 6/2006 | Carter et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0182317 A1 | 8/2007 | Kido et al. |
| 2008/0001512 A1 | 1/2008 | Nomura |
| 2008/0211416 A1* | 9/2008 | Negley et al. ............... 315/193 |
| 2008/0246704 A1 | 10/2008 | Kawase |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2012/0161165 A1 | 6/2012 | Yamazaki |
| 2012/0161167 A1 | 6/2012 | Yamazaki |
| 2012/0161174 A1 | 6/2012 | Yamazaki |

FOREIGN PATENT DOCUMENTS

| | | |
|---|---|---|
| EP | 0 917 127 A1 | 5/1999 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 388 894 A2 | 2/2004 |
| EP | 1 619 654 A1 | 1/2006 |
| JP | 06-208342 A | 7/1994 |
| JP | 11-273856 A | 10/1999 |
| JP | 11-307261 A | 11/1999 |
| JP | 2000-029404 A | 1/2000 |
| JP | 2002-132218 A | 5/2002 |
| JP | 2002-532848 | 10/2002 |
| JP | 2004-069774 A | 3/2004 |
| JP | 2004-234868 A | 8/2004 |
| JP | 2006-049853 | 2/2006 |
| JP | 2006-108651 | 4/2006 |
| JP | 2009-130132 | 6/2009 |
| WO | WO 98/36406 | 8/1998 |
| WO | WO 00/36662 | 6/2000 |
| WO | WO 03/037040 | 5/2003 |
| WO | 2012045857 * | 4/2012 |

OTHER PUBLICATIONS

Tokito et al., "Metal Oxides as a Hole-Injecting Layer for an Organic Electroluminescent Device," J. Phys. D: Appl. Phys. (Journal of Physics D: Applied Physics), 1996, vol. 29, pp. 2750-2753.

* cited by examiner

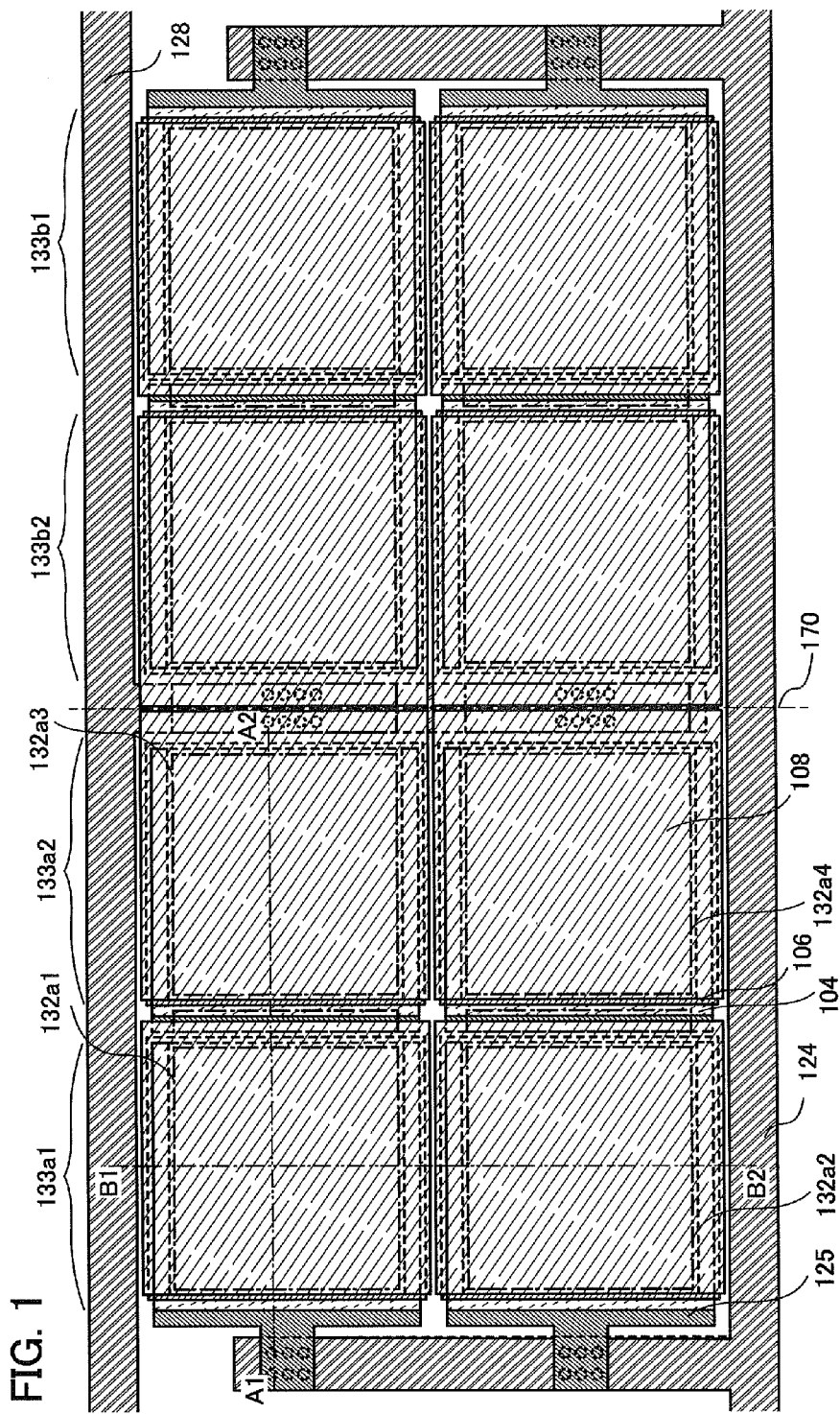

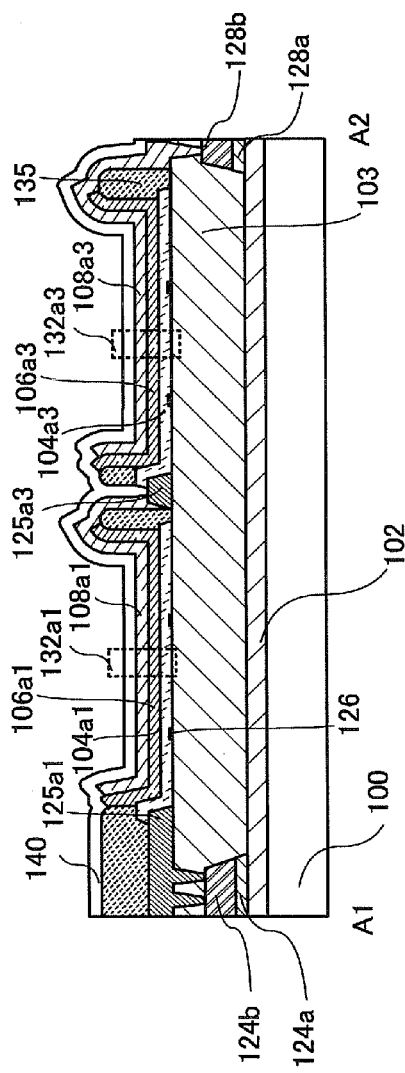
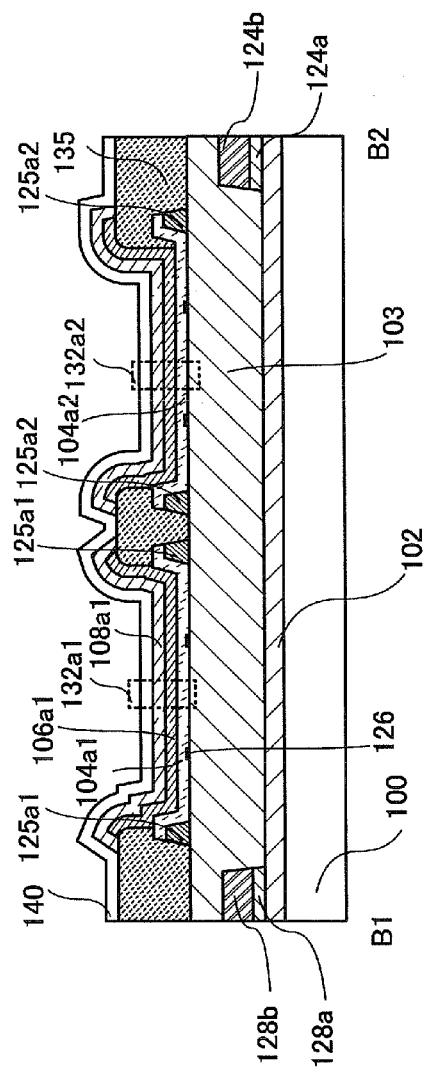
FIG. 4A
FIG. 4B

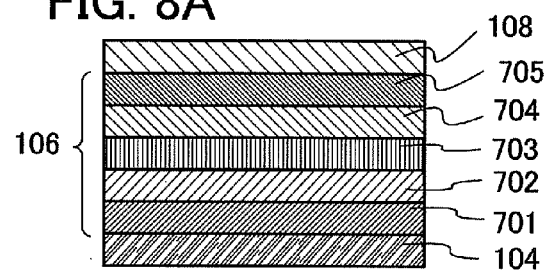
FIG. 8A
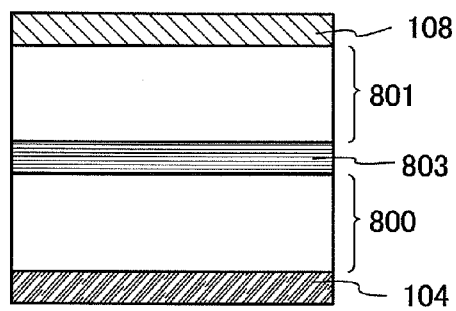
FIG. 8B1
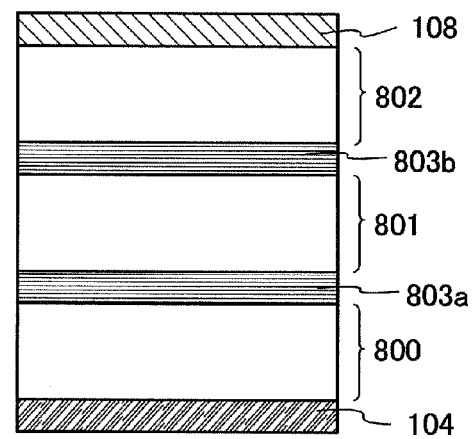
FIG. 8B2
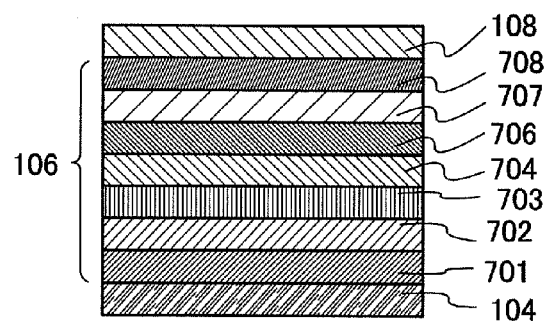
FIG. 8C

FIG. 13A1
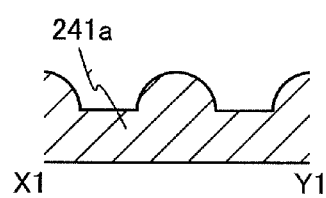
FIG. 13A2
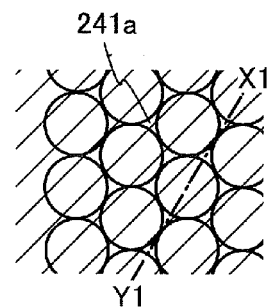
FIG. 13B1
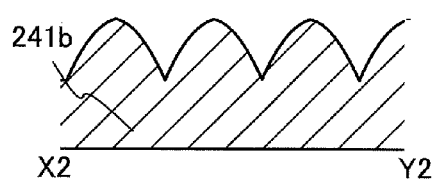
FIG. 13B2
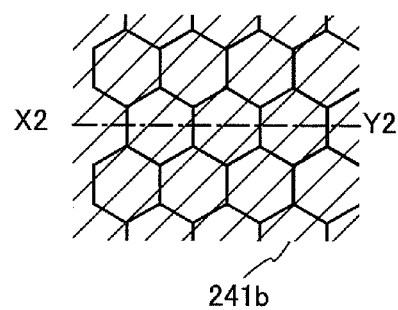

LIGHTING DEVICE

BACKGROUND OF THE INVENTION

1. Field of the Invention

The present invention relates to a lighting device including a light-emitting member which exhibits electroluminescence (EL).

2. Description of the Related Art

Light-emitting elements containing organic compounds as light-emitting bodies have been expected to be applied to next-generation lighting. Light-emitting elements containing organic compounds as light-emitting bodies have features such as drive at a low voltage with low power consumption.

An EL layer included in a light-emitting element includes at least a light-emitting layer. In addition, the EL layer can have a layered structure including a hole injection layer, a hole transport layer, an electron transport layer, an electron injection layer, and/or the like, in addition to the light-emitting layer.

It is said that, as for a light-emitting mechanism of a light-emitting element, an EL layer is interposed between a pair of electrodes and voltage is applied to the EL layer, so that electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excited states, and light emission can probably be achieved through either of the excited states.

Further, since the pair of electrodes and the light-emitting layer are formed as films in such a light-emitting element, surface light emission can easily be obtained by forming a large-area light-emitting element. This is a feature which is hard to obtain in light sources such as incandescent lamps and LEDs (point light sources) or in fluorescent lamps (line light sources), so that the above light-emitting element has a high utility value as a light source such as lighting.

Patent Documents 1 and 2 disclose light-emitting devices in each of which a plurality of light-emitting elements is connected in series.

REFERENCE

[Patent Document 1] Japanese Published Patent Application No. 2006-049853

[Patent Document 2] Japanese Published Patent Application No. 2006-108651

SUMMARY OF THE INVENTION

An object of one embodiment of the present invention is to provide a lighting device which is provided with a relatively large light-emitting region by integration of a plurality of light-emitting elements, and a manufacturing method thereof.

Another object of one embodiment of the present invention is to provide a lighting device which is thin and lightweight.

Another object of one embodiment of the present invention is to provide a lighting device which can resist an impulse such as a drop impulse.

When a lighting device having a relatively large light-emitting region is fabricated, one of a pair of electrode layers of a light-emitting element is formed using a conductive material having a light-transmitting property. A conductive material having a light-transmitting property, such as indium tin oxide (hereinafter referred to as ITO) has a resistance value larger than that of a metal material used for a wiring layer, such as aluminum or titanium. Thus, when a conductive layer, a wiring, or the like is formed using a conductive material having a light-transmitting property, a voltage drop is likely to be caused. Note that a current path in a conductive layer including a material with a large resistance value has resistance in any case, which leads to a voltage drop.

For integration of a plurality of light-emitting elements and suppression of a voltage drop, the light-emitting elements are connected in series, a plurality of auxiliary wirings with different widths and different thicknesses is used, and the arrangement of the auxiliary wirings, electrodes, the light-emitting elements, and the like is optimized.

One embodiment of the present invention is a lighting device including plural stages of light-emitting element units; a first wiring in contact with the first-stage light-emitting element unit of the plural stages of light-emitting element units; and a second wiring in contact with the last-stage light-emitting element unit of the plural stages of light-emitting element units. The first-stage light-emitting element unit includes at least a first light-emitting element and a second light-emitting element which are connected in parallel. The light-emitting element unit adjacent to the first-stage light-emitting element unit includes at least a third light-emitting element and a fourth light-emitting element which are connected in parallel. The first light-emitting element, the second light-emitting element, the third light-emitting element, and the fourth light-emitting element each include a first electrode layer with a light-transmitting property, an organic compound-containing layer which is in contact with the first electrode layer, a second electrode layer with reflectivity which is in contact with the organic compound-containing layer, and an auxiliary wiring which is in contact with the first electrode layer and has a narrower width than the first wiring and the second wiring. The second electrode layer of the first light-emitting element and the auxiliary wiring of the third light-emitting element are connected to each other, whereby the first light-emitting element and the third light-emitting element are connected in series. The second electrode layer of the second light-emitting element and the auxiliary wiring of the fourth light-emitting element are connected to each other, whereby the second light-emitting element and the fourth light-emitting element are connected in series. The auxiliary wiring of each of the light-emitting elements in the first-stage light-emitting element unit is in contact with the first wiring. The second electrode layer of each of the light-emitting elements in the last-stage light-emitting element unit is in contact with the second wiring.

Note that the number of stages of the light-emitting element units is two or more, the light-emitting element unit in contact with the first wiring is referred to as the first-stage light-emitting element unit, and the light-emitting element unit in contact with the second wiring is referred to as the last-stage light-emitting element unit. For example, when the number of stages of the light-emitting element units is four, the first-stage light-emitting element unit is provided so as to be adjacent to the second-stage light-emitting element unit, the second-stage light-emitting element unit is provided so as to be adjacent to the third-stage light-emitting element unit, and the third-stage light-emitting element unit is provided so as to be adjacent to the fourth-stage (last-stage) light-emitting element unit.

In one embodiment of the lighting device having the above structure, the thickness of each of the first wiring and the second wiring is greater than or equal to 3 μm and less than or equal to 30 μm, and the thickness of the auxiliary wiring is greater than or equal to 0.1 μm and less than 3 μm. The first wiring, the second wiring, and the auxiliary wiring each include a conductive layer containing copper and have low resistance. The auxiliary wiring is provided in contact with the first electrode layer having a light-transmitting property, whereby a voltage drop is suppressed.

With the above structure, the plurality of light-emitting elements can emit light efficiently or the total emission area can be increased.

Further, plural kinds of auxiliary wirings each having a smaller thickness and a narrower line width than the first wiring and the second wiring may be provided. One embodiment of the present invention is a lighting device including plural stages of light-emitting element units connected in series; a first wiring in contact with the first-stage light-emitting element unit of the plural stages of light-emitting element units; and a second wiring in contact with the last-stage light-emitting element unit of the plural stages of light-emitting element units. The first-stage light-emitting element unit includes at least a first light-emitting element and a second light-emitting element which are connected in parallel. The light-emitting element unit adjacent to the first-stage light-emitting element unit includes at least a third light-emitting element and a fourth light-emitting element which are connected in parallel. The first light-emitting element, the second light-emitting element, the third light-emitting element, and the fourth light-emitting element each include a first electrode layer with a light-transmitting property, an organic compound-containing layer which is in contact with the first electrode layer, a second electrode layer with reflectivity which is in contact with the organic compound-containing layer, a first auxiliary wiring which is in contact with the first electrode layer and has a narrower width than the first wiring and the second wiring, and a second auxiliary wiring which is in contact with the first electrode layer and has a narrower width than the first auxiliary wiring. The second electrode layer of the first light-emitting element and the first auxiliary wiring of the third light-emitting element are connected to each other, whereby the first light-emitting element and the third light-emitting element are connected in series. The second electrode layer of the second light-emitting element and the first auxiliary wiring of the fourth light-emitting element are connected to each other, whereby the second light-emitting element and the fourth light-emitting element are connected in series. The first auxiliary wiring of each of the light-emitting elements in the first-stage light-emitting element unit is in contact with the first wiring. The second electrode layer of each of the light-emitting elements in the last-stage light-emitting element unit is in contact with the second wiring.

In one embodiment of the lighting device having the above structure, the thickness of each of the first wiring and the second wiring is greater than or equal to 3 μm and less than or equal to 30 μm, the thickness of the first auxiliary wiring is greater than or equal to 0.1 μm and less than 3 μm, and the thickness of the second auxiliary wiring is greater than or equal to 3 nm and less than or equal to 30 nm. The first wiring, the second wiring, the first auxiliary wiring, and the second auxiliary wiring each include a conductive layer containing copper and have low resistance. The first auxiliary wiring and the second auxiliary wiring are provided in contact with the first electrode layer having a light-transmitting property, whereby a voltage drop is suppressed. Although the second auxiliary wiring overlaps with a light-emitting region of the light-emitting element, the total area of light emission is less likely to be influenced by the second auxiliary wiring because the second auxiliary wiring has a smaller thickness and a narrower line width than the first auxiliary wiring.

In each of the light-emitting elements of one embodiment of the lighting device having the above structure, an insulating layer which is over and in contact with the first electrode layer and has an opening is provided and the organic compound-containing layer is in contact with the first electrode layer in the opening. The insulating layer is called a partition wall or a bank and prevents a short circuit between the adjacent light-emitting elements. The area of the opening formed in the insulating layer, namely, the area of a region where the organic compound-containing layer and the first electrode layer is in contact with each other is equal to or substantially equal to the area of an emission region of one light-emitting element in a plan view.

One embodiment of the lighting device having the above structure includes first plural stages of light-emitting element units and second plural stages of light-emitting element units adjacent to the first plural stages of light-emitting element units. The first plural stages of light-emitting element units and the second plural stages of light-emitting element units are arranged axisymmetrically with respect to the length direction of the second wiring in a plan view. The plurality of light-emitting element units is provided axisymmetrically and a plurality of wirings which is extended in the linear direction corresponding to that of the symmetry axis and is given the same potentials may be formed as one wiring, leading to a reduction in total number of wirings.

In one embodiment of the lighting device having the above structure, the first light-emitting element and the second light-emitting element are connected in parallel. The second electrode layer of the first light-emitting element is in contact with the first electrode layer of the third light-emitting element, whereby the first light-emitting element and the third light-emitting element are connected in series. The second electrode layer of the second light-emitting element is in contact with the first electrode layer of the fourth light-emitting element, whereby the second light-emitting element and the fourth light-emitting element are connected in series. Serial connection enables application of a higher voltage to the lighting device; thus, the load on a converter can be reduced.

In one embodiment of the lighting device having the above structure, the plural stages of light-emitting element units are provided over a substrate having an insulating surface and functioning as a housing. The substrate having an insulating surface has recessed portions in which the first wiring and the second wiring are provided in a plan view. The first wiring and the second wiring are covered with a planarization film.

In one embodiment of the lighting device having the above structure, light emitted from the first light-emitting element, the second light-emitting element, the third light-emitting element, and the fourth light-emitting element passes through the substrate having an insulating surface and then is extracted. An optical member such as a microlens array or a diffusion plate may be provided over the substrate having an insulating surface as necessary to provide a large-area lighting device capable of more uniform light emission.

An inorganic insulating film (inorganic insulator) covering a top surface of the light-emitting element is preferably provided to improve reliability. Further, an inorganic insulating film may be provided between an emission surface of the light-emitting element and the housing. The inorganic insulating film serves as a sealing film or a protective layer which blocks an external contaminant such as water. The inorganic insulating film can be formed to have either a single-layer structure or a layered structure using any of a nitride film and a nitride oxide film. As the inorganic insulator, thin glass can be used. By providing the inorganic insulating film, deterioration of the light-emitting element can be suppressed and the durability and the lifetime of the lighting device can be improved.

The shape of the emission surface of the light-emitting element may be a circular shape or a polygonal shape such as a quadrangle. The shape of the housing covering the light-emitting element may correspond to the shape of the emission surface and can be a rectangular solid, a polygonal cylinder, a cylinder, or the like.

Further, the EL layer may have a layered structure including two or more layers provided with an intermediate layer laid therebetween. By stacking a plurality of EL layers with different emission colors, an emission color to be provided can be controlled. By stacking a plurality of EL layers even with the same emission color, an effect of improving power efficiency can be obtained.

Further, the EL layer may have a layered structure including, as one of layers, a layer containing a composite material in which an acceptor substance is mixed with an organic compound having a high hole transport property. The layer containing a composite material is in contact with the second electrode layer, whereby a short circuit of the light-emitting element can be suppressed.

Note that in this specification, a lighting device refers to a light-emitting device or a light source (including lighting) and includes a light-emitting element provided with at least a light-emitting layer between a pair of electrodes. Further, the lighting device includes the following modules in its category: a module in which a connector such as a flexible printed circuit (FPC), a tape automated bonding (TAB) tape, or a tape carrier package (TCP) is attached to a lighting device; and a module having a TAB tape or a TCP provided with a converter or the like at the end thereof.

According to one embodiment of the present invention, a lighting device which is provided with a relatively large light-emitting region by integration of a plurality of light-emitting elements and a manufacturing method thereof can be provided.

According to one embodiment of the present invention, a lighting device which is thin and lightweight can be provided.

When plastic or a thin metal plate is used as a substrate used for a lighting device, the lighting device can have resistance against an impulse such as a drop impulse.

In a lighting device according to one embodiment of the present invention, a plurality of light-emitting elements can emit light efficiently or the total area of light emission can be increased.

According to one embodiment of the present invention, a lighting device can be formed by connecting a plurality of light-emitting element units of given stages in series or in series-parallel combination; thus, the lighting device can be increased in size. For example, it is possible to realize a lighting device whose emission region is one surface of a large substrate with a size corresponding to G5.5 (1100 mm×1300 mm) to G11 (3000 mm×3300 mm) of the size of a mother glass substrate of a liquid crystal panel.

BRIEF DESCRIPTION OF THE DRAWINGS

In the accompanying drawings:

FIG. 1 is a plan view illustrating a lighting device;

FIGS. 4A and 4B are cross-sectional views illustrating a lighting device;

FIGS. 8A, 8B1, 8B2, and 8C are diagrams each illustrating an example of a light-emitting element applicable to a lighting device;

FIGS. 13A1 and 13A2 are a cross-sectional view and a plan view illustrating a lighting device, respectively, and FIGS. 13B1 and 13B2 are a cross-sectional view and a plan view illustrating a lighting device, respectively.

DETAILED DESCRIPTION OF THE INVENTION

Figure 2A:
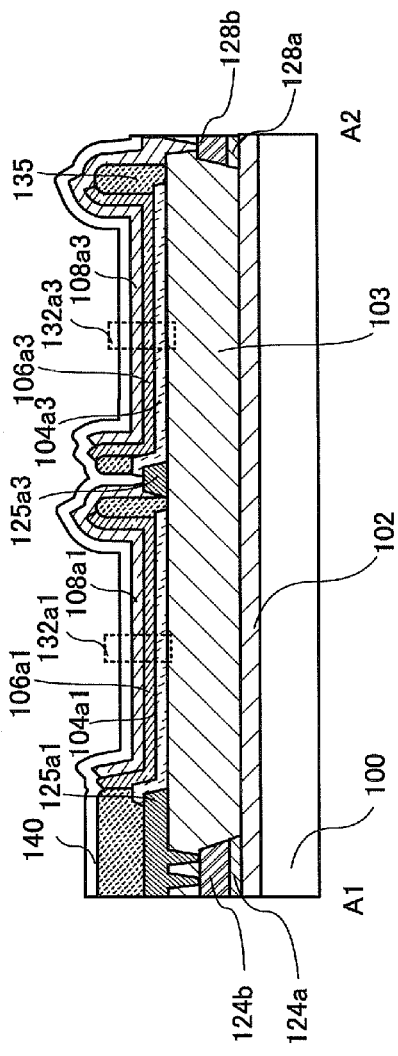
FIGS. 2A and 2B are cross-sectional views illustrating a lighting device.

Embodiments will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the following descriptions of the embodiments. In the structures to be given below, the same portions or portions having similar functions are denoted by the same reference numerals in different drawings, and descriptions thereof will not be repeated.

Embodiment 1

In this embodiment, a lighting device according to an embodiment of the present invention will be described with reference to FIG. 1, FIGS. 2A and 2B, FIG. 3, FIGS. 4A and 4B, FIG. 5, FIGS. 6A and 6B, FIG. 7, FIGS. 11A and 11B, FIGS. 12A and 12B, and FIGS. 13A1, 13A2, 13B1, and 13B2. Note that common portions are denoted by the same reference numerals in FIG. 1, FIGS. 2A and 2B, FIG. 3, FIGS. 4A and 4B, FIG. 5, FIGS. 6A and 6B, FIG. 7, FIGS. 11A and 11B, FIGS. 12A and 12B, and FIGS. 13A1, 13A2, 13B1, and 13B2.

Figure 2B:
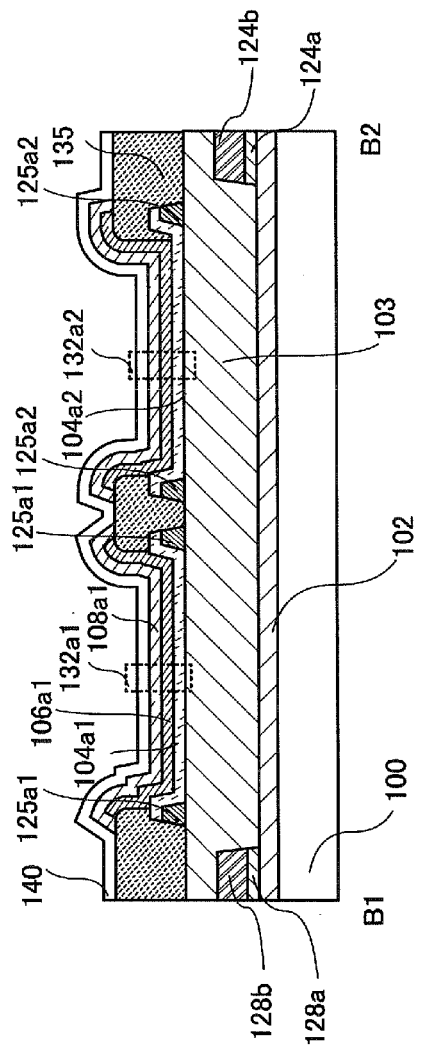

FIG. 1 is a plan view illustrating part of a lighting device according to this embodiment. FIG. 2A is a cross-sectional view along A1-A2 in FIG. 1, and FIG. 2B is a cross-sectional view along B1-B2 in FIG. 1.

FIG. 1 is the plan view of the lighting device in which a plurality of light-emitting elements is arranged between a first wiring 124 and a second wiring 128. In this embodiment, eight light-emitting elements are used for simplification; however, the number of the light-emitting elements is not particularly limited.

The first wiring 124 is a lead wiring which has a great line width and a large thickness and is formed using a low resistance material. The first wiring 124 is electrically connected to a power source (not illustrated here), and current is supplied to each of the light-emitting elements through the first wiring 124.

The second wiring 128 is a lead wiring which has a great line width and a large thickness and is formed using a low resistance material. The second wiring 128 is given a fixed potential (also referred to as a common potential).

The first wiring 124 and the second wiring 128 can also be referred to as main wirings and branch at a variety of positions. Note that a line width of a branching portion of the first wiring 124 is substantially equal to a line width of a branching portion of the second wiring 128. Although FIG. 1 illustrates an example in which the direction of the portions branching from one first wiring 124 is the same and the first wiring has a comb-like shape, one embodiment of the present invention is not particularly limited thereto. In a layout of the wiring, branching portions thereof may be axisymmetrical with respect to the length direction of the wiring (a layout of a lattice-like wiring), or branching portions thereof may be alternately branched from the wiring. The first wiring 124 and the second wiring 128 are each preferably formed to a thickness in the range of greater than or equal to 3 μm and less than or equal to 30 μm with the use of a low resistance material. For example, the first wiring 124 and the second wiring 128 are each formed to have a single-layer structure or a layered structure using a material selected from aluminum (Al), titanium (Ti), tantalum (Ta), tungsten (W), molybdenum (Mo), chromium (Cr), neodymium (Nd), scandium (Sc), nickel (Ni), and copper (Cu) or an alloy material including any of these materials as its main component.

To form the first wiring 124 and the second wiring 128, plating treatment (an electrolytic plating method or an electroless plating method) may be performed. As a metal material to be plated, a low resistance material such as copper, silver, gold, chromium, iron, nickel, platinum, or an alloy thereof can be used.

In this embodiment, the first wiring 124 has a two-layer structure of a titanium layer and a copper layer over the titanium layer. A first layer and a second layer of the first wiring 124 are denoted by reference numerals 124a and 124b, respectively, as in FIGS. 2A and 2B. Further, a first layer and a second layer of the second wiring 128 are denoted by reference numerals 128a and 128b, respectively. The first wiring 124 and the second wiring 128 are provided with the insulating layer 103 laid therebetween to keep a distance between the first wiring 124 and the second wiring 128 so as not to be in contact with each other and not to cause a short circuit, as in FIG. 2B.

The insulating layer 103 can be formed using an inorganic insulating material or an organic insulating material. Note that an organic insulating material having heat resistance, such as an acrylic resin, a polyimide, a benzocyclobutene-based resin, a polyamide, or an epoxy resin, is preferably used as a planarization insulating film. Other than such organic insulating materials, it is possible to use a low-dielectric constant material (a low-k material), a siloxane-based resin, phosphosilicate glass (PSG), borophosphosilicate glass (BPSG), or the like. The insulating layer 103 may be formed by stacking a plurality of insulating films formed using any of these materials.

There is no particular limitation on the method for forming the insulating layer 103, and the insulating layer 103 can be formed, depending on a material thereof, by a sputtering method, a spin coating method, a dipping method, a printing method, an ink-jet method, or the like.

As illustrated in FIG. 2A, the first wiring 124 is electrically connected to a first electrode layer 104a1 of a first light-emitting element 132a1 through an auxiliary wiring 125a1. The first light-emitting element 132a1 includes the first electrode layer 104a1, an EL layer 106a1, and a second electrode layer 108a1. Light from the EL layer 106a1 is emitted through the first electrode layer 104a1 and a housing 100 to the outside; thus, an emission surface is on the first electrode layer 104a1 side. Accordingly, the first electrode layer 104a1 and a housing 100 transmit at least light from the EL layer 106a1.

As a material of the first electrode layer 104a1, indium oxide ($In_2O_3$), tin oxide ($SnO_2$), zinc oxide (ZnO), ITO, an indium oxide-zinc oxide alloy ($In_2O_3$—ZnO), or any of these metal oxide materials in which silicon oxide is contained can be used. Alternatively, graphene may be used as a material of the first electrode layer 104a1.

The first wiring 124 is electrically connected to a first electrode layer 104a2 of a second light-emitting element 132a2 through an auxiliary wiring 125a2.

In this embodiment, eight light-emitting elements are categorized into plural stages of light-emitting element units for simplification.

The first light-emitting element 132a1 and the second light-emitting element 132a2 are collectively referred to as a first-stage light-emitting element unit 133a1. The plurality of light-emitting elements in the first-stage light-emitting element unit 133a1 is connected in parallel.

Current from the power source is supplied to the EL layer 106a1 through the first wiring 124, the auxiliary wiring 125a1, and the first electrode layer 104a1. The second electrode layer 108a1 electrically connected to the EL layer 106a1 is electrically connected to the auxiliary wiring 125a3.

The second electrode layer 108a1 is preferably formed using a metal having a low work function (typically, a metal element which belongs to Group 1 or Group 2 of the periodic table), or an alloy thereof. Specifically, aluminum or an aluminum alloy is used for the second electrode layer 108a1. However, when aluminum or an aluminum alloy is provided in direct contact with ITO or the like, the aluminum or the aluminum alloy might possibly be corroded. Therefore, in this embodiment, the second electrode layer 108a1 of the first light-emitting element 132a1 is not provided in direct contact with the first electrode layer 104a3 of the third light-emitting element 132a3 serially connected to the first light-emitting element 132a1, but is connected to the first electrode layer 104a3 through the auxiliary wiring 125a3.

The auxiliary wiring 125a3 can be formed to have a single-layer structure or a layered structure using a material such as copper (Cu), titanium (Ti), tantalum (Ta), tungsten (W), molybdenum (Mo), chromium (Cr), neodymium (Nd), scandium (Sc), or nickel (Ni) or an alloy material containing any of these materials as its main component. Aluminum may be used as a material of the auxiliary wiring 125a3. When aluminum is used as a material of the auxiliary wiring 125a3, a layered structure in which aluminum is used as a layer not in contact with ITO or the like may be employed so that the problem of corrosion described above is not caused. The auxiliary wiring 125a3 has a narrower line width and a smaller thickness than the first wiring and the second wiring. Specifically, the thickness of the auxiliary wiring 125a3 is greater than or equal to 0.1 μm and less than 3 μm.

Further, the second-stage light-emitting element unit, the last-stage light-emitting element unit 133a2 in this embodiment, is provided so as to be adjacent to the first-stage light-emitting element unit 133a1.

The last-stage light-emitting element unit 133a2 includes the third light-emitting element 132a3 serially connected to the first light-emitting element 132a1 in the first-stage light-emitting element unit 133a1.

In FIG. 2A, the plurality of light-emitting elements is connected in series. The auxiliary wiring 125a3 is electrically connected to the first electrode layer 104a3 of the third light-emitting element 132a3. The first electrode layer 104a3 is electrically connected to an EL layer 106a3. The second electrode layer 108a3 electrically connected to the EL layer 106a3 is electrically connected to the second wiring 128.

Further, as illustrated in FIG. 2A, in the lighting device, an insulating layer 135 which is over and in contact with the first electrode layers and has openings is provided, and the EL layers are in contact with the first electrode layers in the openings. The insulating layer 135 prevents a short circuit between the adjacent light-emitting elements. As illustrated in FIG. 2B, the insulating layer 135 is provided between the plurality of light-emitting elements which is adjacent to each other and connected in parallel, and end portions of the EL layers are located over the insulating layer 135. In addition, as illustrated in FIG. 2B, end portions of the second electrode layers are located over the insulating layer 135 provided between the plurality of light-emitting elements which is adjacent to each other and connected in parallel. Further, as illustrated in FIG. 2B, the plurality of light-emitting elements is connected in parallel, and as illustrated in FIG. 2A, an inorganic insulating film 140 is in contact with the insulating layer 135 between the plurality of light-emitting elements which is adjacent to each other.

The insulating layer 135 is formed using an organic insulating material such as a polyimide, acrylic, a polyamide, or epoxy, or an inorganic insulating material. It is particularly preferable that the insulating layer 135 be formed using a photosensitive resin material to have openings over the first electrode layers so that sidewalls of the openings are formed to have tilted surfaces with continuous curvature.

Note that the second electrode layers 108a2 and 108a3 can be formed using a material and a manufacturing process which are similar to those of the second electrode layer 108a1. The auxiliary wirings 125a1 and 125a2 can be formed using a material and a manufacturing process similar to those of the auxiliary wiring 125a3 described above.

The last-stage light-emitting element unit 133a2 includes a fourth light-emitting element 132a4 serially connected to the second light-emitting element 132a2 in the first-stage light-emitting element unit 133a1.

The light-emitting element unit connected to and in contact with the second wiring 128 is the last-stage light-emitting element unit 133a2.

Further, as illustrated in FIG. 1, the first wiring 124 branches at two positions to have protruding portions, and the second wiring 128 branches at one position to have a protruding portion. In FIG. 1, the protruding portions are provided in comb-like shapes.

Furthermore, in FIG. 1, the protruding portions branching from the two positions of the first wiring 124 are parallel to or substantially parallel to each other and also parallel to the protruding portion branching from the one position of the second wiring 128. The first-stage light-emitting element unit 133a1 and the last-stage light-emitting element unit 133a2, that is, the first to the fourth light-emitting elements are provided between the protruding portion branching from the first position of the two position of the first wiring 124, and the protruding portion branching from the one position of the second wiring 128.

It is also a feature of this embodiment that the protruding portion branching from the one position which is a part of the second wiring 128 is straight in the length direction, and a layout is axisymmetric with respect to the straight line as a symmetry axis. In FIG. 1, a straight line 170 corresponds to the symmetry axis.

A first-stage light-emitting element unit 133b1 and a last-stage light-emitting element unit 133b2, that is, the fifth to the eighth light-emitting elements are provided between the protruding portion branching from the second position of the two positions of the first wiring 124, and the protruding portion branching from the one position of the second wiring 128.

The protruding portion branching from the one position of the second wiring 128 is provided between the last-stage light-emitting element unit 133a2 and the last-stage light-emitting element unit 133b2. In this manner, the plurality of light-emitting element units is provided axisymmetrically and a plurality of wirings whose length direction corresponds to that of the symmetry axis and which is given the same potentials is formed as one wiring, leading to a reduction in total number of wirings.

Note that the inorganic insulating film 140 covering a top surface of the light-emitting element 132 is preferably provided. In addition, an inorganic insulator 102 may be provided between the emission surface of the light-emitting element 132 and a housing 100. The inorganic insulating film 140 and the inorganic insulator 102 function as protective layers or sealing films which block an external contaminant such as water. By providing the inorganic insulating film 140 and the inorganic insulator 102, deterioration of the light-emitting element 132 can be suppressed and thus, the durability and the lifetime of the lighting device can be increased.

As each of the inorganic insulating film 140 and the inorganic insulator 102, a single layer or a stack using a nitride film and a nitride oxide film can be used. Specifically, the inorganic insulating film 140 and the inorganic insulator 102 can be formed using silicon oxide, silicon nitride, silicon oxynitride, aluminum oxide, aluminum nitride, aluminum oxynitride, or the like by a CVD method, a sputtering method, or the like depending on the material. The inorganic insulating film 140 and the inorganic insulator 102 are preferably formed using silicon nitride by a CVD method. The thickness of the inorganic insulating film may be approximately 100 nm to 1 μm.

Alternatively, as each of the inorganic insulating film 140 and the inorganic insulator 102, an aluminum oxide film, a diamond like carbon (DLC) film, a carbon film containing nitrogen, or a film containing zinc sulfide and silicon oxide (e.g., a $ZnS.SiO_2$ film) may be used.

As the inorganic insulator 102, a thin glass substrate can be used. For example, a glass substrate with a thickness in the range of greater than or equal to 30 μm and less than or equal to 100 μm can be used.

When a glass substrate or the like is used for the inorganic insulator 102, entry of moisture, an impurity, or the like into an organic compound and a metal material which are contained in the light-emitting element from the outside of the lighting device can be suppressed. Consequently, deterioration of the light-emitting element due to moisture, an impurity, or the like can be suppressed, leading to improvement in reliability of the lighting device. In addition, the lighting device can have resistance against bending and breaking, and a reduction in weight of the lighting device can be achieved because the glass substrate has a small thickness, a thickness in the range of greater than or equal to 30 μm and less than or equal to 100 μm.

As specific examples of a member used for the housing 100, plastic (an organic resin), glass, quartz, and the like can be given. As an example of plastic, a member made of polycarbonate, polyarylate, polyethersulfone, or the like can be given. It is preferable to use plastic for the housing 100 because a reduction in weight of the lighting device can be achieved. In addition, the lighting device can have resistance against an impulse such as a drop impulse when plastic is used for the housing 100.

FIG. 1 and FIGS. 2A and 2B illustrate an example in which the auxiliary wirings each having a smaller thickness and a narrower line width than the first wiring and the second wiring is provided; however, auxiliary wirings each having a narrower line width and a smaller thickness (specifically, greater than or equal to 3 nm and less than or equal to 30 nm) than the auxiliary wiring may be provided in addition to the auxiliary wirings.

Figure 3:
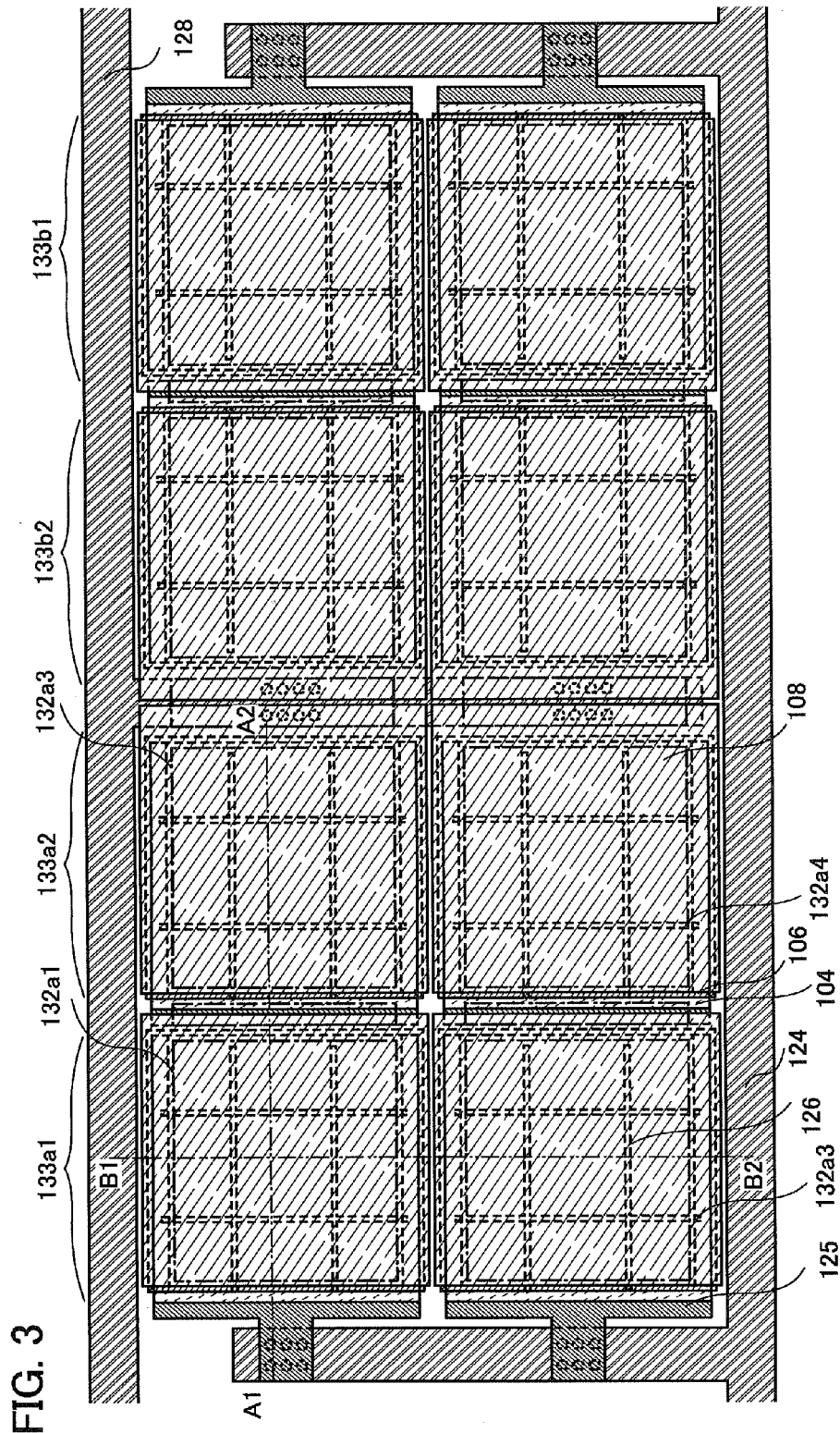
FIG. 3 is a plan view illustrating a lighting device.

FIG. 3 is a plan view where auxiliary wirings each having a small thickness is provided. Note that FIG. 4A is a cross-sectional view along A1-A2 in FIG. 3, and FIG. 4B is a cross-sectional view along B1-B2 in FIG. 3. A structure except for the auxiliary wirings each having a small thickness is the same as that of FIG. 1 and FIGS. 2A and 2B; thus, specific description thereof is omitted here.

FIG. 3 illustrates an example in which auxiliary wirings 126 whose pattern shapes are mesh-like shapes are provided. As in FIG. 3, the auxiliary wirings 126 are provided in contact with the auxiliary wirings 125 and are electrically connected to the auxiliary wirings 125. As in FIG. 3 and FIGS. 4A and 4B, the auxiliary wirings 126 are formed in contact with the first electrode layers 104 and are located to overlap with light-emitting regions. The auxiliary wirings 126 each having a smaller thickness and a narrower line width than the auxiliary wiring 125 is less likely to influence the total area of light emission. Although FIGS. 4A and 4B illustrate an example in which the auxiliary wirings 126 are provided over the insulating layer 103, the auxiliary wirings 126 may be provided over the first electrode layers 104.

The use of a material such as copper for formation of the auxiliary wiring 126 can suppress a voltage drop when the first electrode layer 104 has a large area. The material of the second auxiliary wiring is not limited to copper and may be the same as a material of the auxiliary wiring 125.

The pattern shape of the auxiliary wiring 126 is not limited to a mesh-like shape but may be a stripe shape. It is preferable that the pattern shape, the width, and the thickness of the auxiliary wiring 126 and the resistivity of a material of the auxiliary wiring 126 be adjusted as appropriate depending on the shape and the area of the first electrode layer 104 by a practitioner so that a voltage drop is suppressed as much as possible.

In the cases of the structures in FIG. 1, FIGS. 2A and 2B, FIG. 3, and FIGS. 4A and 4B, the first wiring, the second wiring, the auxiliary wiring (or the second auxiliary wiring), and the first electrode layer can be formed through a photolithography process. The EL layer can be formed using a deposition mask, and a pattern of the second electrode layer can also be formed using a deposition mask.

Figure 5:
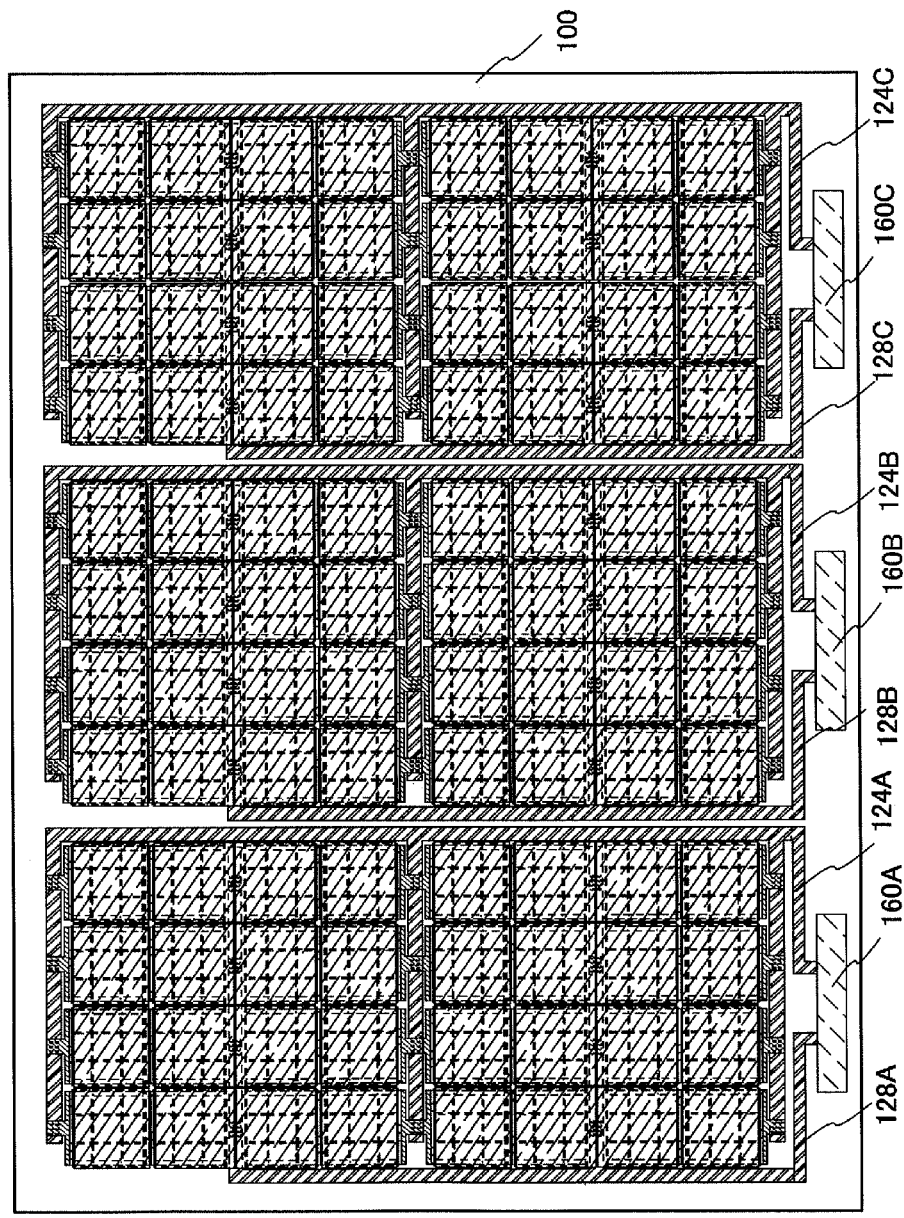
FIG. 5 is a plan view illustrating a lighting device.

When a glass substrate having a large area, e.g., an area of 720 mm×600 mm or an area of 750 mm×620 mm, is used for the housing 100, a layout in FIG. 5 is possible. FIG. 5 illustrates an example in which a plurality of light-emitting elements is efficiently arranged over a glass substrate having a large area with the use of the structure in FIG. 3.

A block A includes a first wiring 124A branching at a plurality of positions, a second wiring 128A, and plural stages of light-emitting units between the first wiring 124A and the second wiring 128A.

A block B includes a first wiring 124B branching at a plurality of positions, a second wiring 128B, and plural stages of light-emitting units between the first wiring 124B and the second wiring 128B.

A block C includes a first wiring 124C branching at a plurality of positions, a second wiring 128C, and plural stages of light-emitting units between the first wiring 124C and the second wiring 128C.

It is needless to say that the block A, the block B, and the block C have the same patterns. Further, converters are illustrated in FIG. 5; a first converter 160A, a second converter 160B, and a third converter 160C are provided in the block A, the block B, and the block C, respectively, to form one large lighting device. Note that the structure in FIG. 5 is only an example; thus, the number of blocks is not limited to that of the structure in FIG. 5. For example, the number of blocks may be five.

In the cases of the structures in FIG. 1, FIGS. 2A and 2B, FIG. 3, and FIGS. 4A and 4B, a photomask is used and exposure is performed in a photolithography process. For example, when a glass substrate with a size of 720 mm×600 mm is used and an exposure apparatus which can expose an area of 310 mm×560 mm to one shot of light, it is preferable to perform exposure of the block A, the block B, and the block C, which are illustrated in FIG. 5, to a first shot of light, a second shot of light, and a third shot of light, respectively, for efficient exposure. Note that it is needless to say that the size of an area which can be exposed to one shot of light can be changed by optical adjustment, and the positions to be exposed are adjusted so that a region to be exposed to one shot of light does not overlap with a region to be exposed to another shot of light.

In the layout of FIG. 5, branching main wirings like costae are provided and the main wirings each have first auxiliary wirings like lateral veins. This state is like a state of a leaf having plural veins with different thicknesses. Further, the first auxiliary wiring has second auxiliary wirings which are extremely thin. It can be said that in the wiring layout in FIG. 5, the plural wirings with different thicknesses efficiently supply current from a power source to a plurality of light-emitting elements, like plural veins with different thicknesses of a leaf.

Note that in the lighting device described in this embodiment, the light-emitting element 132 may be provided in a housing. In that case, the housing for sealing the light-emitting element 132 may be a combination of a plurality of housings attached to each other. For example, another housing is provided to face the housing 100 so that the light-emitting element 132 is encapsulated, which enables sealing of the light-emitting element 132. The housing provided opposite to the housing 100 can be formed using a material similar to that of the housing 100.

Figure 7:
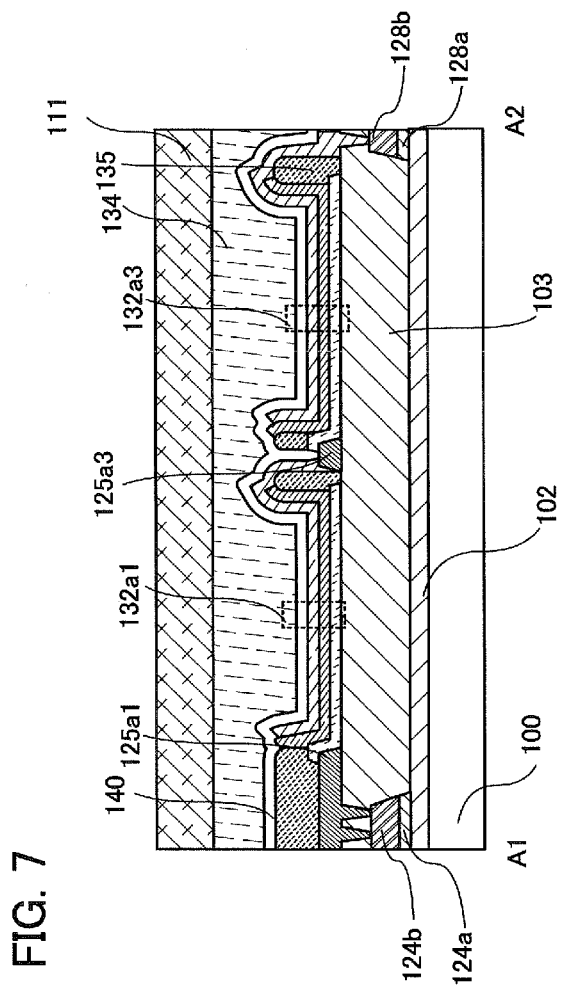
FIG. 7 is a cross-sectional view illustrating a lighting device.

Further, as illustrated in FIG. 7, a top surface of the light-emitting element 132 may be provided with a metal plate 111 opposite to the housing 100. There is no particular limitation on the thickness of the metal plate 111; however, the metal plate with a thickness in the range of greater than or equal to 10 μm and less than or equal to 200 μm is preferably used because a reduction in weight of the lighting device can be achieved. A material of the metal plate 111 is not limited to a particular material, but it is preferable to use a metal such as aluminum, copper, or nickel, an alloy such as an aluminum alloy or stainless steel, or the like.

The metal plate 111 and the housing 100 are attached to each other with an adhesive layer 134, so that the light-emitting element 132 can be sealed in. As the adhesive layer 134, a visible light curable adhesive, a UV curable adhesive, or a thermosetting adhesive can be used. As examples of materials of such adhesives, an epoxy resin, an acrylic resin, a silicone resin, a phenol resin, and the like can be given. A moisture-absorbing substance serving as a drying agent may be contained in the adhesive layer 134.

Since the metal plate 111 has low permeability, sealing of the light-emitting element 132 with the metal plate 111 and the housing 100 can prevent entry of moisture into the light-emitting element 132. Thus, by providing the metal plate 111, a highly reliable lighting device in which deterioration due to moisture is suppressed can be obtained.

An inorganic insulating film, a glass substrate, a quartz substrate, or the like may be used instead of the metal plate 111.

A moisture-absorbing substance serving as a drying agent may be provided in a space where the light-emitting element 132 is provided. The moisture-absorbing substance may be placed as a solid such as a powdery substance or may be provided as a film containing a moisture-absorbing substance over the light-emitting element 132 by a deposition method such as a sputtering method.

The shape of the emission surface of the light-emitting element 132 may be a circular shape or a polygonal shape such as a quadrangle, and the shape of the housing covering the emission surface may correspond to the shape of the emission surface.

Further, a plurality of light-emitting elements having different emission colors is provided and connected to an external power source individually to control a current value and a voltage value, so that light emission color from the lighting device can be adjusted and color rendering properties thereof can be improved.

Figure 6:
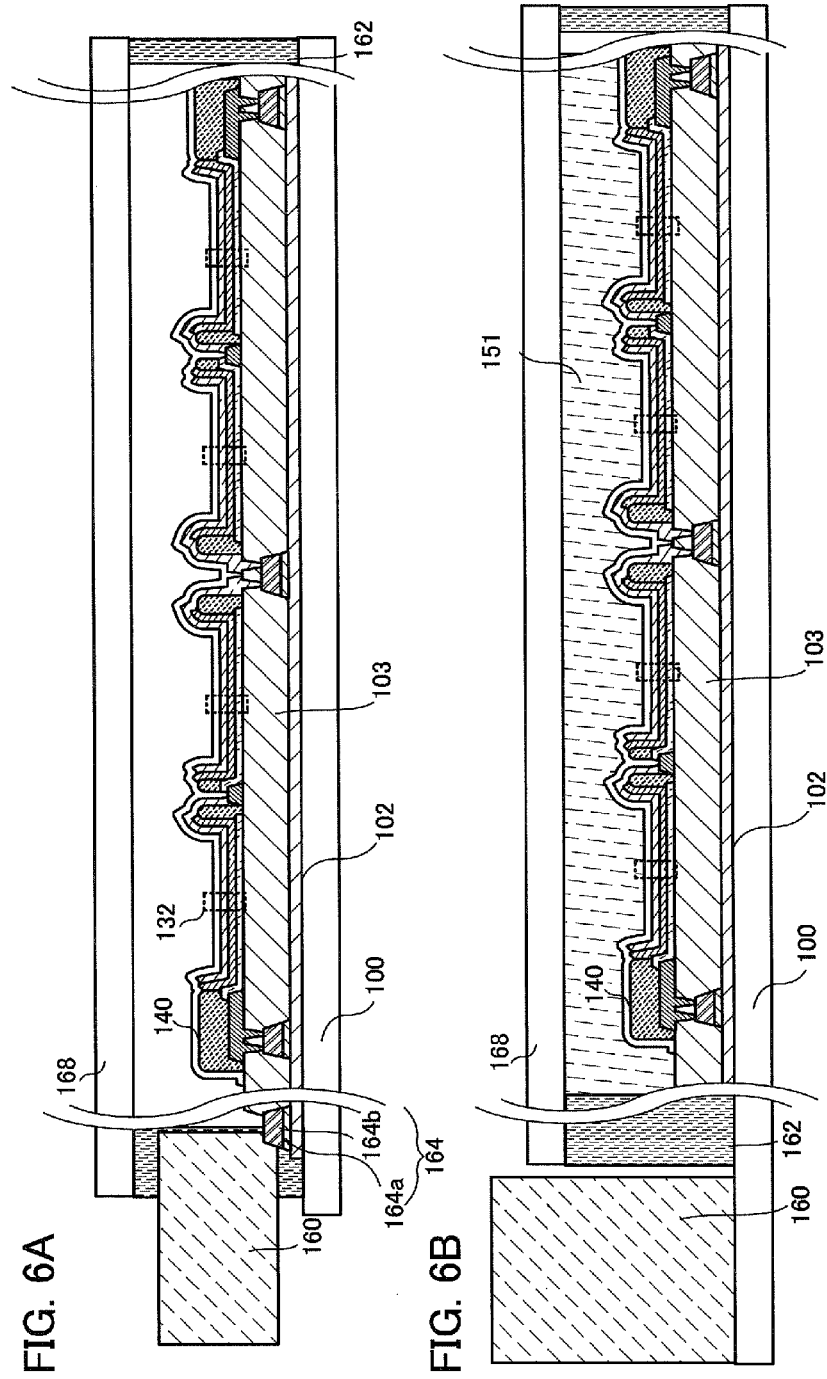
FIGS. 6A and 6B are cross-sectional views each illustrating a lighting device.

FIGS. 6A and 6B are examples of cross-sectional views of lighting devices incorporating converters. Note that a converter refers to a constant current power source which converts input power into a constant current suited to specifications of a lighting device and supplies the constant current to the lighting device, or a converter circuit functioning as a constant voltage power source which converts input power into a constant voltage suited to specifications of a lighting device and supplies the constant voltage to the lighting device.

The lighting device in FIG. 6A is connected to a converter 160 through a terminal electrode 164. In FIG. 6A, the terminal electrode 164 has a layered structure of a first layer 164a and a second layer 164b. The terminal electrode 164 can be formed in the same step as the first wiring 124 and the second wiring 128. In the lighting device in FIG. 6A, the light-emitting element 132 is sealed with the housing 100, a housing 168, and a sealant 162. For the housing 168 opposite to the housing 100, a metal plate, a material similar to that of the housing 100, or the like can be used.

The first electrode layer 104 and the second electrode layer 108 which are included in the light-emitting element 132 are electrically connected to the converter 160, and a current suited to specifications of the lighting device, which is obtained by conversion in the converter 160, is supplied to the light-emitting element 132. Since current is supplied from both sides of the light-emitting element to the light-emitting element, luminance unevenness can be reduced and concentration of a load to part of the light-emitting element can be suppressed.

Note that it is preferable that a wiring for connecting the converter 160 overlap with a non-light-emitting region of the lighting device in order not to reduce light extraction efficiency of the lighting device. The converter 160 may be provided so as to protrude to be higher than a region sealed with the sealant 162 as in FIG. 6B. Alternatively, the converter 160 is not provided over the housing 100 and may be provided externally.

As illustrated in FIG. 6B, a region between the inorganic insulating film 140 and the housing 168 may be filled with a resin 151. As the resin 151, an epoxy resin, an acrylic resin, a silicone resin, a phenol resin, or the like can be used. Filling of the region between the inorganic insulating film 140 and the housing 168 with the resin 151 allows the lighting device to withstand the weight of an object when the object is placed over the housing 168.

In FIGS. 6A and 6B, the converter 160 is a DC-DC converter and includes a printed circuit board (not illustrated). When a printed circuit board is used, insulation of a connection surface between the printed circuit board and a terminal electrode is ensured, which facilitates alignment in provision of the printed circuit board over the terminal electrode. As the printed circuit board, a flexible printed circuit board (FPC) or a semi-flexible printed circuit board partly having flexibility may be used. When a flexible printed circuit board is used, a converter can be incorporated in a flexible lighting device or a lighting device having a curved surface.

Note that a circuit element provided in the converter 160 may be formed so as to be embedded in the insulating layer 103 in order to prevent the thickness of the lighting device from increasing when the converter 160 is provided over the terminal electrode.

As described above, when a converter is incorporated in a lighting device, a malfunction in which overcurrent flows to a light-emitting element can be prevented owing to a function of supplying a stable current suited to an element even if an input voltage varies. Further, a lighting device which is usable even without an external converter can be provided, so that the utilization range of lighting devices is widened. Furthermore, provision of a converter or a connection wiring over a non-light-emitting region enables suppression of a decrease in area of a light-emitting region; thus, a lighting device with high illuminance can be provided.

Note that a converter included in the lighting device according to this embodiment is not limited to a DC-DC converter and may be an AC-DC converter which converts AC voltage into DC voltage. When an AC-DC converter is used, an AC power supply can be applied without conversion. Further, the number of light-emitting elements electrically connected to one converter in the lighting device according to this embodiment is not limited to that of the structure described in this embodiment.

Figure 11A:
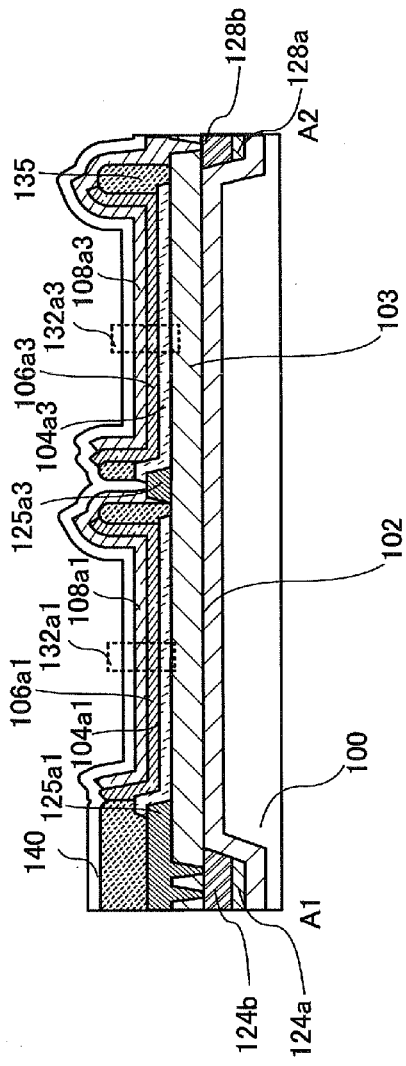
FIGS. 11A and 11B are cross-sectional views illustrating a lighting device.
Figure 11B:
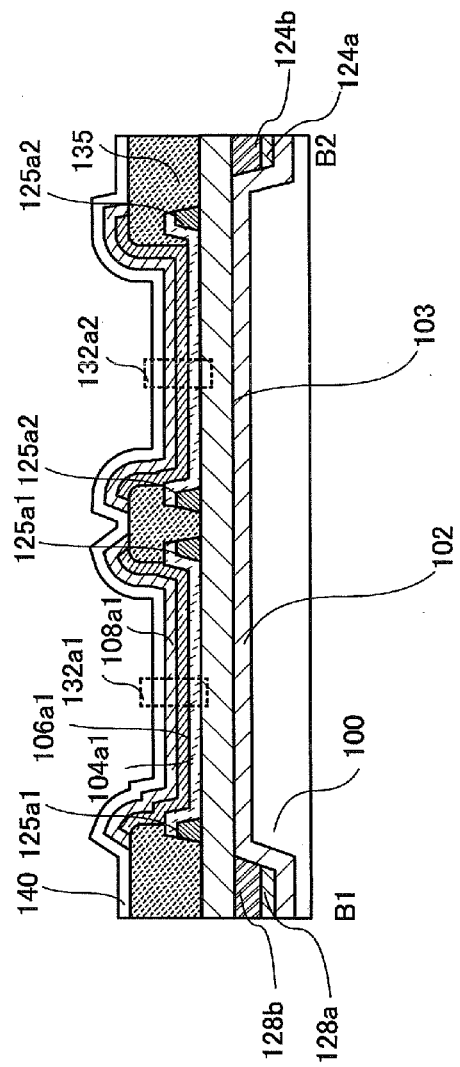

As illustrated in FIGS. 11A and 11B, the first wirings 124 (124a and 124b) and the second wirings 128 (128a and 128b) may be provided so as to be embedded in recessed portions of the housing 100.

The recessed portions of the housing 100 may be formed by etching or by processing an organic resin with a supporter serving as a mold so that the organic resin has depressions and projections.

In the case where the inorganic insulator 102 is provided over the housing 100 having the recessed portions, the inorganic insulator 102 may be formed over the housing 100, and then the auxiliary wirings may be formed over the inorganic insulator 102 so as to fill the recessed portion of the housing 100.

An optical film may be provided on the emission surface side of the lighting device. For example, the housing 100 may be provided with a diffusion film in a region which covers the emission surface and is opposite to the light-emitting element 132 side. Further, to increase extraction efficiency, a lens array overlapping with the plurality of light-emitting elements 132 may be provided on the emission surface side.

Figure 12A:
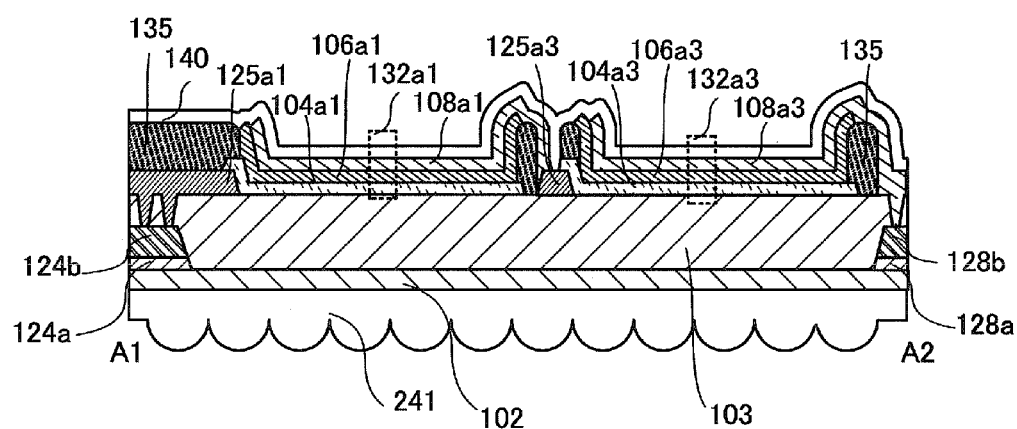
FIGS. 12A and 12B are cross-sectional views each illustrating a lighting device.
Figure 12B:
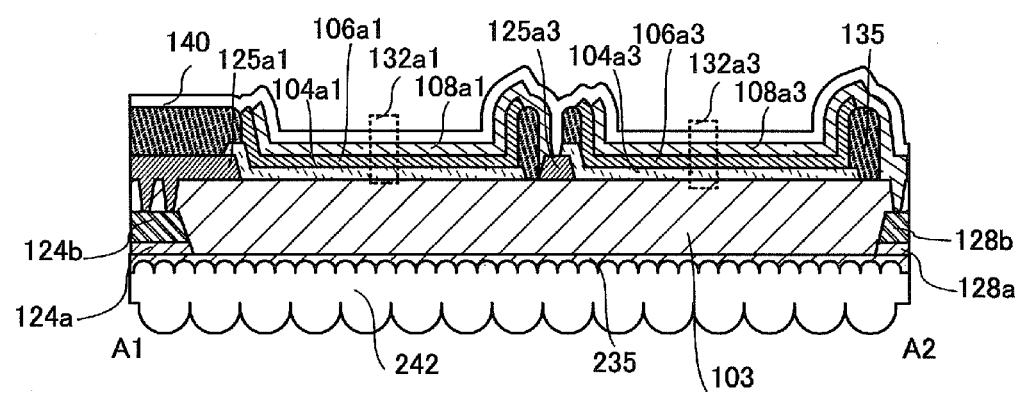

FIGS. 12A and 12B are examples of using housings 241 and 242 each having an uneven shape including a plurality of projections like the shape of a microlens array on the emission surface side (the side opposite to the light-emitting element 132 side). When any of the structures of the housings 241 and 242 each having an uneven shape including a plurality of projections is used as the structure of the housing 100, total reflection at the interface between the air and the housing 241/242 can be suppressed; thus, the efficiency of light extraction to the outside of the housing can be improved.

Further, provision of such a housing having an uneven shape allows diffusion of light of a light-emitting element, which is emitted to the outside; thus, even adverse effects caused when a light-blocking auxiliary wiring is provided over the emission surface can be reduced. Accordingly, a lighting device can emit light uniformly and favorably.

The housing 241 having an uneven shape can be formed using an organic resin as its material. The organic resin can be processed by heat treatment or light irradiation treatment depending on characteristics of the organic resin. For example, a support having an uneven shape and serving as a mold of the uneven shape of the housing is prepared, a thermoplastic organic resin is used as the material of the housing, the thermoplastic organic resin is pressed in the support while performing heat treatment so that the shape of the thermoplastic organic resin is changed to reflect the shape of the support, and then the thermoplastic organic resin is cured by cooling; thus, the housing 241 having an uneven shape can be formed.

As a specific example of a member used for the housing 241, an organic resin (plastic) is given. As an example of plastic, a member made of polycarbonate, polyarylate, polyethersulfone, or the like is given.

FIGS. 13A1, 13A2, 13B1, and 13B2 illustrate cross-sectional views and plan views of the housing 241 in FIG. 12A. FIGS. 13A2 and 13B2 illustrate examples of plan views of housings 241a and 241b each having an uneven shape. FIG. 13A1 is a cross-sectional view along X1-Y1 in FIG. 13A2 and FIG. 13B1 is a cross-sectional view along X2-Y2 in FIG. 13B2.

The housing 241a illustrated in FIGS. 13A1 and 13A2 has an uneven shape in which a projection has a semispherical shape. The housing 241b illustrated in FIGS. 13B1 and 13B2 has an uneven shape in which the base of a projection is a regular hexagon. The pitch or the bottom shape of the plurality of projections included in the housing 241 can be set variously and is not limited to the structures in FIGS. 13A1, 13A2, 13B1, and 13B2. For example, the housing 121a may have an uneven shape with an apex, such as a circular cone or a pyramid (e.g., a triangular pyramid or a square pyramid). Note that it is preferable to employ a so-called honeycomb structure for an uneven shape in which the base of a projection is a regular hexagon as illustrated in FIGS. 13B1 and 13B2 because the density of arrangement of the uneven shape can be improved and the extraction efficiency of light to the outside of the housing can be further improved.

Further, as illustrated in FIG. 12B, the housing 242 having an uneven shape including a plurality of projections, like a microlens array, may be used on both the emission surface side (on the side opposite to the light-emitting element 132) and the light-emitting element 132 side.

The housing 242 illustrated in FIG. 12B has uneven shapes each including a plurality of projections on both sides. Further, in FIG. 12B, the uneven shape including a plurality of projections provided on the light-emitting element 132 side overlap with the light-emitting element 132. A high refractive index material layer 235 is provided in a region having the uneven shape on the light-emitting element 132 side with respect to the housing 242, so as to be in contact with the uneven shape. Note that the uneven shape provided on the housing 242 is arranged in a stripe shape, which is effective, but is preferably arranged in a matrix shape.

The housing 242 illustrated in FIG. 12B has the uneven shape including a plurality of projections on the emission surface side of the housing 242, whereby total reflection at the interface between the housing 242 and the air can be suppressed. Moreover, the uneven shape including a plurality of projections is provided between the housing 242 and the high refractive index material layer 235, whereby total reflection at the interface between the high refractive index material layer 235 and the housing 242 can be suppressed and the extraction efficiency of light to the outside of the housing can be further improved.

As examples of a material that can be used for the housing 242, glass, a resin, and the like whose refractive index is greater than 1.0 and less than 1.6 are given. As the resin, a polyester resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, or the like can be used. In particular, a material whose refractive index is greater than or equal to 1.4 and less than 1.6 is preferably used.

As a method for forming an uneven shape in the above material, for example, an etching method, a sand blasting method, a microblast processing method, a droplet discharge method, a printing method (screen printing or offset printing by which a pattern is formed), a coating method such as a spin coating method, a dipping method, a dispenser method, an imprint method, a nanoimprint method, or the like can be employed as appropriate.

The high refractive index material layer 235 is formed of high refractive index glass, a high refractive index liquid, or a high refractive index resin. The high refractive index material layer 235 has a light-transmitting property and the refractive index is greater than or equal to 1.6, preferably greater than or equal to 1.7 and less than or equal to 2.1. As examples of the high refractive index glass, a resin containing bromine, a resin containing sulfur, and the like are given. For example, a sulfur-containing polyimide resin, an episulfide resin, a thiourethane resin, a brominated aromatic resin, or the like can be used. Alternatively, polyethylene terephthalate (PET), triacetyl cellulose (TAC), or the like may be used. As the high refractive index liquid, a contact liquid (refractive liquid) containing sulfur and methylene iodide, or the like can be used. Any of a variety of methods suitable for the material may be employed for forming the high refractive index material layer 235. For example, the above resin is selectively formed in contact with the uneven shape including a plurality of projections provided on the light-emitting element 132 side of the housing 242 by a spin coating method and is cured by heat or light, so that the high refractive index material layer 235 can be formed. The material and the deposition method can be selected as appropriate in consideration of the adhesion strength, ease of processing, or the like. Note that the high refractive index material layer 235 also functions as a planarization film for the uneven shape including a plurality of projections provided on the light-emitting element 132 side of the housing 242.

In general, a resin with a high refractive index is expensive, but in the lighting device illustrated in FIG. 12B, the high refractive index material layer 235 may be selectively formed in a region overlapping with the light-emitting element 132 and in contact with the uneven shape including a plurality of projections, and the thickness of the high refractive index material layer 235 is several tens of micrometers, which is small. Thus, the lighting device with high light extraction efficiency can be manufactured at low cost.

The size and the height of the projection of the uneven shape on the side which is in contact with the high refractive index material layer 235 are each preferably approximately 0.1 μm to 100 μm. The size and the height of the projection of the uneven shape on the opposite side are each preferably approximately 0.1 μm to 1000 μm. The size of the projection of the uneven shape on the side which is in contact with the high refractive index material layer 235 affects the amount of material used for the high refractive index material layer 235; thus, the allowable range of the size and the height of the projection is narrow. In contrast, the projection included in the uneven shape on the opposite side may have a size or height exceeding 1000 μm. In particular, each of the projections included in the uneven shapes on both sides preferably have a size or height of greater than or equal to 1 μm because an influence of interference of light can be suppressed.

Further, in FIG. 12B, the high refractive index material layer 235 is provided between the light-emitting element 132 and the housing 242. When a nitride film with a refractive index in the range of greater than or equal to 1.6 is used as the high refractive index material layer 235, diffusion of impurities to the light-emitting element can be prevented without a decrease in the extraction efficiency of light, which is preferable.

According to one embodiment of the present invention, a lighting device can be formed by connecting a plurality of light-emitting element units of given stages in series or in series-parallel combination; thus, the lighting device can be increased in size. For example, it is possible to realize a lighting device whose emission region is one surface of a large substrate with a size corresponding to G5.5 (1100 mm×1300 mm) to G11 (3000 mm×3300 mm) of the size of a mother glass substrate of a liquid crystal panel.

Further, the lighting device according to this embodiment can be thin and lightweight.

When plastic or a thin metal plate is used for a substrate, a lighting device which can resist an impulse such as a drop impulse can be provided.

In the lighting device according to this embodiment, the plurality of light-emitting elements can emit light efficiently or the total emission area can be increased.

Embodiment 2

In this embodiment, an example of an element structure of a light-emitting element exhibiting organic EL emission, which is used in a lighting device according to one embodiment of the present invention, will be described. The light-emitting element exhibiting organic EL emission generates a smaller amount of heat than an LED. Thus, an organic resin can be used for a housing, so that a reduction in weight of the lighting device is possible, which is preferable.

The light-emitting element illustrated in FIG. 8A includes the first electrode layer 104, an EL layer 106 over the first electrode layer 104, and the second electrode layer 108 over the EL layer 106.

The EL layer 106 includes at least a light-emitting layer containing a light-emitting organic compound. In addition, the EL layer 106 can have a layered structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, a hole injection layer 701, a hole transport layer 702, a light-emitting layer 703, an electron transport layer 704, and an electron injection layer 705 are stacked in this order from the first electrode layer 104 side in the EL layer 106.

A method for manufacturing the light-emitting element illustrated in FIG. 8A will be described.

First, the first electrode layer 104 is formed. The first electrode 104 is provided in the direction in which light is extracted from the EL layer, and thus is formed using a light-transmitting material.

As the light-transmitting material, indium oxide, ITO, an indium oxide-zinc oxide alloy (also referred to as IZO (registered trademark)), zinc oxide, zinc oxide to which gallium is added, graphene, or the like can be used.

As the first electrode layer 104, a metal material such as gold, platinum, nickel, tungsten, chromium, molybdenum, iron, cobalt, copper, palladium, or titanium can be used. Alternatively, a nitride of the metal material (such as titanium nitride), or the like may be used. In the case of using the metal material (or the nitride thereof), the first electrode layer 104 may be thinned so as to be able to transmit light.

Next, the EL layer 106 is formed over the first electrode layer 104. In this embodiment, the EL layer 106 includes the hole injection layer 701, the hole transport layer 702, the light-emitting layer 703, the electron transport layer 704, and the electron injection layer 705.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$) or copper(II) phthalocyanine (abbreviation: CuPc) may be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still alternatively, any of high molecular compounds (e.g., oligomers, dendrimers, or polymers) may be used. Examples of the high-molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole injection layer 701, a composite material in which an organic compound having a high hole transport property is mixed with an acceptor substance is preferably used. With the use of the composite material in which an organic compound having a high hole transport property is mixed with an acceptor substance, excellent hole injection from the first electrode layer 104 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the first electrode layer 104 to the EL layer 106 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ cm$^2$/Vs or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl) triphenylamine (abbreviation: BPAFLP), and carbazole compounds such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl) anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis [2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: F$_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Among these, molybdenum oxide is particularly preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

For the hole transport layer 702, a high molecular compound such as PVK, PVTPA, PTPDMA, or Poly-TPD may be used.

The light-emitting layer 703 is a layer containing a light-emitting organic compound. As the light-emitting organic compound, for example, a fluorescent compound which exhibits fluorescence or a phosphorescent compound which exhibits phosphorescence can be used.

The fluorescent compounds that can be used for the light-emitting layer 703 will be given. Examples of a material for blue light emission include N,N'-bis[4-(9H-carbazol-9-yl) phenyl]-N,N'-diphenylstilbene-4,4'-diamine (abbreviation: YGA2S), 4-(9H-carbazol-9-yl)-4'-(10-phenyl-9-anthryl) triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include N-(9,10-diphenyl-2-anthryl)-N, 9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include organometallic complexes such as bis[2-(2'-benzo[4, 5-α]thienyl)pyridinato-N,C$^{3'}$]iridium(III) acetylacetonate (abbreviation: Ir(btp)$_2$(acac)), bis(1-phenylisoquinolinato-N, C$^{2'}$)iridium(III) acetylacetonate (abbreviation: Ir(piq)$_2$ (acac)), (acetylacetonato)bis[2,3-bis(4-fluorophenyl)quinoxalinato]iridium(III) (abbreviation: Ir(Fdpq)$_2$(acac)), and 2,3,7,8,12,13,17,18-octaethyl-21H,23H-porphyrin platinum (II) (abbreviation: PtOEP). Examples of a material for red light emission include N,N,N',N'-tetrakis(4-methylphenyl) tetracene-5,11-diamine (abbreviation: p-mPhTD), and 7,14-diphenyl-N,N,N',N'-tetrakis(4-methylphenyl)acenaphtho[1, 2-a]fluoranthene-3,10-d iamine (abbreviation: p-mPhAFD).

The phosphorescent compounds that can be used for the light-emitting layer 703 will be given. Examples of a material for blue light emission are include bis[2-(4',6'-difluorophenyl)pyridinato-N,C²'iridium(III)tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C2'}iridium (III) picolinate (abbreviation: Ir(CF₃ ppy)₂(pic)), and bis[2-(4',6'-difluorophenyl)pyridinato-N,C²']iridium(III) acetylacetonate (abbreviation: FIr(acac)). Examples of a material for green light emission include tris(2-phenylpyridinato-N,C²')iridium(III) (abbreviation: Ir(ppy)₃), bis(2-phenylpyridinato-N,C²')iridium(III)acetylacetonate (abbreviation: Ir(ppy)₂(acac)), bis(1,2-diphenyl-1H-benzimidazolato) iridium(III)acetylacetonate (abbreviation: Ir(pbi)₂(acac)), bis (benzo[h]quinolinato)iridium(III)acetylacetonate (abbreviation: Ir(bzq)₂(acac)), and tris(benzo[h]quinolinato) iridium(III) (abbreviation: Ir(bzq)₃). Examples of a material for yellow light emission include bis(2,4-diphenyl-1,3-oxazolato-N,C²')iridium(III)acetylacetonate (abbreviation: Ir(dpo)₂(acac)), bis[2-(4'-perfluorophenylphenyl)pyridinato] iridium(III)acetylacetonate (abbreviation: Ir(p-PF-ph)₂ (acac)), bis(2-phenylbenzothiazolato-N,C²')iridium(III) acetylacetonate (abbreviation: Ir(bt)₂(acac)), (acetylacetonato)bis[2,3-bis(4-fluorophenyl)-5-methylpyrazinato]iridium(III) (abbreviation: Ir(Fdppr-Me)₂ (acac)), and (acetylacetonato)bis {2-(4-methoxyphenyl)-3,5-dimethylpyrazinato}iridium(III) (abbreviation: Ir(dmmoppr) ₂(acac)). Examples of a material for orange light emission include tris(2-phenylquinolinato-N,C²')iridium(III) (abbreviation: Ir(pq)₃), bis(2-phenylquinolinato-N,C²')iridium(III) acetylacetonate (abbreviation: Ir(pq)₂(acac)), (acetylacetonato)bis(3,5-dimethyl-2-phenylpyrazinato)iridium(III) (abbreviation: Ir(mppr-Me)₂(acac)), and (acetylacetonato) bis(5-isopropyl-3-methyl-2-phenylpyrazinato)iridium(III) (abbreviation: Ir(mppr-iPr)₂(acac)). Examples of a material for red light emission include organometallic complexes such as bis[2-(2'-benzo[4,5-a]thienyl)pyridinato-N,C³']iridium (III)acetylacetonate (abbreviation: Ir(btp)₂(acac)), bis(1-phenylisoquinolinato-N,C²')iridium(III)acetylacetonate (abbreviation: Ir(piq)₂(acac)), (acetylacetonato)bis[2,3-bis(4-fluorophenyl)quinoxalinato]iridium(III) (abbreviation: Ir(Fdpq)₂(acac)), (acetylacetonato)bis(2,3,5-triphenylpyrazinato)iridium(III) (abbreviation: Ir(tppr)₂(acac)), (dipivaloylmethanato)bis(2,3,5-triphenylpyrazinato)iridium (III) (abbreviation: Ir(tppr)₂(dpm)), and 2,3,7,8,12,13,17,18-octaethyl-21H,23H-porphyrinplatinum(II) (abbreviation: PtOEP). Further, rare-earth metal complexes, such as tris (acetylacetonato)(monophenanthroline)terbium(III) (abbreviation: Tb(acac)₃(Phen)), tris(1,3-diphenyl-1,3-propanedionato)(monophenanthroline)europium(III) (abbreviation: Eu(DBM)₃(Phen)), and tris[1-(2-thenoyl)-3,3,3-trifluoroacetonato](monophenanthroline)europium(III) (abbreviation: Eu(TTA)₃(Phen)), exhibit light emission from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq₃), bis(10-hydroxybenzo[h]quinolinato) beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato] zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl) phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)](abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Note that the light-emitting layer 703 may have a layered structure of two or more layers. When the light-emitting layer 703 has a layered structure of two or more layers and the kinds of light-emitting substances for light-emitting layers vary, a variety of emission colors can be obtained. In addition, a plurality of light-emitting substances of different colors is used as the light-emitting substances, whereby light emission having a broad spectrum or white light emission can also be obtained. In particular, for a lighting device in which high luminance is required, a structure in which light-emitting layers are stacked is preferable.

The electron transport layer 704 is a layer containing a substance having a high electron transport property. As the substance having a high electron transport property, any of the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like may be used. The substances mentioned here are mainly ones that have an electron mobility of $10^{-6}$ cm$^2$/Vs or higher. The electron transport layer is not necessarily a single layer and may be formed of a stack including two or more layers made of the aforementioned substance.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. A substance for forming the electron transport layer 704 may be used.

Note that the hole injection layer 701, the hole transport layer 702, the light-emitting layer 703, the electron transport layer 704, and the electron injection layer 705 which are described above can each be formed by an evaporation method (e.g., a vacuum evaporation method), an ink-jet method, a coating method, or the like.

Note that a plurality of EL layers may be stacked between the first electrode layer 104 and the second electrode layer 108 as illustrated in FIGS. 8B1 and 8B2. FIG. 8B1 illustrates an example including two EL layers, in which a first EL layer 800 and a second EL layer 801 are provided between the first electrode layer 104 and the second electrode layer 108, with a charge generation layer 803 laid between the first EL layer 800 and the second EL layer 801. FIG. 8B2 illustrates an example including three EL layers, in which the first EL layer 800, the second EL layer 801, and a third EL layer 802 are provided between the first electrode layer 104 and the second electrode layer 108, with charge generation layers 803a and 803b laid between the first EL layer 800 and the second EL layer 801 and between the second EL layer 801 and the third EL layer 802, respectively.

When the EL layers are stacked, the electron generation layer (the electron generation layer 803, 803a, or 803b) is preferably provided between the stacked EL layers (between the first EL layer 800 and the second EL layer 801 or between the second EL layer 801 and the third EL layer 802). The charge generation layers 803, 803a, and 803b can each be formed using the above composite material. Further, the charge generation layers 803, 803a, and 803b may each have a layered structure including a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high luminous efficiency and long lifetime can be easily obtained due to expansion in the choice of materials. Moreover, a light-emitting element which provides phosphorescence from one of the EL layers and fluorescence from the other can be readily obtained. Note that this structure can be combined with any of the above structures of the EL layer.

When the charge generation layer is provided between the stacked EL layers as illustrated in FIGS. 8B1 and 8B2, the element can have high luminance and a long lifetime while the current density is kept low. In addition, a voltage drop due to resistance of an electrode material can be reduced, whereby uniform light emission in a large area is possible.

In the case of a stack-type element having a structure in which two EL layers are stacked, white light emission can be extracted outside by allowing a first EL layer and a second EL layer to emit light of complementary colors. White light emission can also be obtained with a structure including a plurality of light-emitting layers in which light emission color of a first EL layer and light emission color of a second EL layer are colors complementary to each other. As complementary relations blue and yellow, blue-green and red, and the like can be given. A substance which emits blue light, yellow light, blue-green light, or red light may be selected as appropriate from, for example, the light-emitting substances given above.

An example of a light-emitting element having a structure in which a plurality of EL layers is stacked will be described below. First, an example of a structure in which each of the first EL layer and the second EL layer includes a plurality of light-emitting layers which emit light of complementary colors will be described. With this structure, white light emission can be obtained.

For example, the first EL layer includes a first light-emitting layer which has an emission spectrum with a peak in the wavelength range of blue to blue-green, and a second light-emitting layer which has an emission spectrum with a peak in the wavelength range of yellow to orange. The second EL layer includes a third light-emitting layer which has an emission spectrum with a peak in the wavelength range of blue-green to green, and a fourth light-emitting layer which has an emission spectrum with a peak in the wavelength range of orange to red.

In this case, light emission from the first EL layer is a combination of light emission from both the first light-emitting layer and the second light-emitting layer and thus exhibits an emission spectrum having both a peak in the wavelength range of blue to blue-green and a peak in the wavelength range of yellow to orange. That is, the first EL layer emits light of two-wavelength type white or a two-wavelength type color close to white.

In addition, light emission from the second EL layer is a combination of light emission from both the third light-emitting layer and the fourth light-emitting layer and thus exhibits an emission spectrum having both a peak in the wavelength range of blue-green to green and a peak in the wavelength range of orange to red. That is, the second EL layer emits light of two-wavelength type white color or a two-wavelength type color close to white, which is different from that of the first EL layer.

Accordingly, by combining the light emission from the first EL layer and the light emission from the second EL layer, white light emission which covers the wavelength range of blue to blue-green, the wavelength range of blue-green to green, the wavelength range of yellow to orange, and the wavelength range of orange to red can be obtained.

Further, the wavelength range of yellow to orange (greater than or equal to 560 nm and less than 580 nm) is a wavelength range of high spectral luminous efficacy; thus, application of an EL layer which includes a light-emitting layer having an emission spectrum peak in the wavelength range of yellow to orange is useful. For example, a structure can be used in which a first EL layer which includes a light-emitting layer having an emission spectrum peak in a blue wavelength range, a second EL layer which includes a light-emitting layer having an emission spectrum peak in an yellow wavelength range, and a third EL layer which includes a light-emitting layer having an emission spectrum peak in a red wavelength range are stacked.

Further, two or more EL layers exhibiting yellow to orange color may be stacked. The power efficiency can be further improved by stacking two or more EL layers exhibiting yellow to orange color.

For example, in the case of a light-emitting element in which three EL layers are stacked as in FIG. 8B1, a second EL layer and a third EL layer each of which includes a light-emitting layer having an emission spectrum peak in yellow to orange wavelength range may be stacked over a first EL layer which includes a light-emitting layer having an emission spectrum peak in a blue wavelength range (greater than or equal to 400 nm and less than 480 nm). Note that the wavelengths of the peaks of the spectra of light emitted from the second EL layer and the third EL layer may be the same or different from each other.

When the number of EL layers which are stacked is increased, the power efficiency of a light-emitting element can be improved; however, there occurs a problem that the manufacturing process becomes complicated. Thus, the structure in which three EL layers are stacked as in FIG. 8B2 is preferable because the power efficiency is high as compared to the case of a structure of two EL layers and the manufacturing process is simple as compared to the case of a structure of four or more EL layers.

The use of the EL layer which has an emission spectrum peak in the yellow to orange wavelength range makes it possible to utilize the wavelength range of high spectral luminous efficacy, allowing improvement in power efficiency. Accordingly, the power efficiency of the whole light-emitting element can be improved. Such a structure is advantageous in terms of spectral luminous efficacy and thus enables improvement in power efficiency as compared to the case where, for example, an EL layer which emits green light and an EL layer which emits red light are stacked to obtain a light-emitting element which emits yellow to orange light. Further, the emission intensity of light of the blue wavelength range of low spectral luminous efficacy is relatively low as compared to the case of using one EL layer which has an emission spectrum peak in the yellow to orange wavelength range of high spectral luminous efficacy; thus, the color of emitted light is close to incandescent color (or warm white), and the power efficiency is improved.

In other words, in the above light-emitting element, the color of light which is obtained by combining light whose emission spectrum peak is in the yellow to orange wavelength range and whose wavelength of the peak is greater than or equal to 560 nm and less than 580 nm and light whose emission spectrum peak is in the blue wavelength range (i.e., the color of light emitted from the light-emitting element) can be natural color like warm white or incandescent color. In particular, incandescent color can be easily achieved.

As a light-emitting substance which emits light having a peak in the yellow to orange wavelength range, for example, an organometallic complex in which a pyrazine derivative functions as a ligand can be used. Alternatively, the light-emitting layer may be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative functions as a ligand is a phosphorescent compound, has high emission efficiency, and easily emits light in the yellow to orange wavelength range, and thus is favorable.

As a light-emitting substance which emits light having a peak in the blue wavelength range, for example, a pyrene diamine derivative can be used. A fluorescent compound can be used as the light-emitting substance which emits light having a peak in the blue wavelength range. The use of a fluorescent compound makes it possible to obtain a light-emitting element which has a longer lifetime than a light-emitting element in which a phosphorescent compound is used. The above pyrene diamine derivative is a fluorescent compound, can obtain an extremely high quantum yield, and has a long lifetime; thus, the above pyrene diamine derivative is favorable.

As illustrated in FIG. 8C, the EL layer may include the hole injection layer 701, the hole transport layer 702, the light-emitting layer 703, the electron transport layer 704, an electron injection buffer layer 706, an electron relay layer 707, and a composite material layer 708 which is in contact with the second electrode layer 108, between the first electrode layer 104 and the second electrode layer 108.

It is preferable to provide the composite material layer 708 which is in contact with the second electrode layer 108 because damage caused to the EL layer 106 particularly when the second electrode layer 108 is formed by a sputtering method can be reduced. The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having high electron injection properties can be used for the electron injection buffer layer 706: an alkali metal, an alkaline earth metal, a rare earth metal, a compound of the above metal (e.g., an alkali metal compound (e.g., an oxide such as lithium oxide, a halide, and carbonate such as lithium carbonate or cesium carbonate), an alkaline earth metal compound (e.g., an oxide, a halide, and carbonate), a rare earth metal compound (e.g., an oxide, a halide, and carbonate), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and carbonate such as lithium carbonate or cesium carbonate), an alkaline earth metal compound (e.g., an oxide, a halide, and carbonate), and a rare earth metal compound (e.g., an oxide, a halide, and carbonate). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is sandwiched between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably greater than or equal to −5.0 eV, more preferably greater than or equal to −5.0 eV and less than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level greater than the acceptor level of the acceptor substance contained in the composite material layer 708 may be used. As a specific energy level of the substance having a LUMO level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (Hex PTC).

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT (CN)$_6$), 2,3-diphenylpyrido[2,3-b]pyrazine (2PYPR), and 2,3-bis(4-fluorophenyl)pyrido[2,3-b]pyrazine (F2PYPR).

Other examples are 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8,8-pentadecafluorooctyl-1,4,5,8-naphthalenetetracarb oxylic diimide (abbreviation: NTCDI-C8F), 3',4'-dibutyl-5,5"-bis(dicyanomethylene)-5,5"-dihydro-2,2':5',2"terthiophen (abbreviation: DCMT), and methanofullerene (e.g., [6,6]-phenyl C$_{61}$ butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the light-emitting layer 703, and the electron transport layer 704 may each be formed using any of the above materials.

Then, the second electrode layer 108 is formed over the EL layer 106.

The second electrode layer 108 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. Alternatively, any of the following may be used: alloys containing aluminum (aluminum alloys) such as an alloy of aluminum and titanium, an alloy of aluminum and nickel, and an alloy of aluminum and neodymium; and an alloy containing silver, such as an alloy of silver and copper. An alloy of silver and copper is preferable because of its high heat resistance. Further, a metal film or a metal oxide film is stacked in contact with an aluminum alloy film, whereby oxidation of the aluminum alloy film can be suppressed. As examples of a material of the metal film or the metal oxide film, titanium and titanium oxide are given. The above materials are preferable because they are present in large amounts in the Earth's crust and inexpensive and thus a reduction in manufacturing cost of a light-emitting element can be achieved.

Note that this embodiment can be freely combined with any of the other embodiments as appropriate.

Embodiment 3

In this embodiment, application examples of a lighting device will be described.

Figure 9:
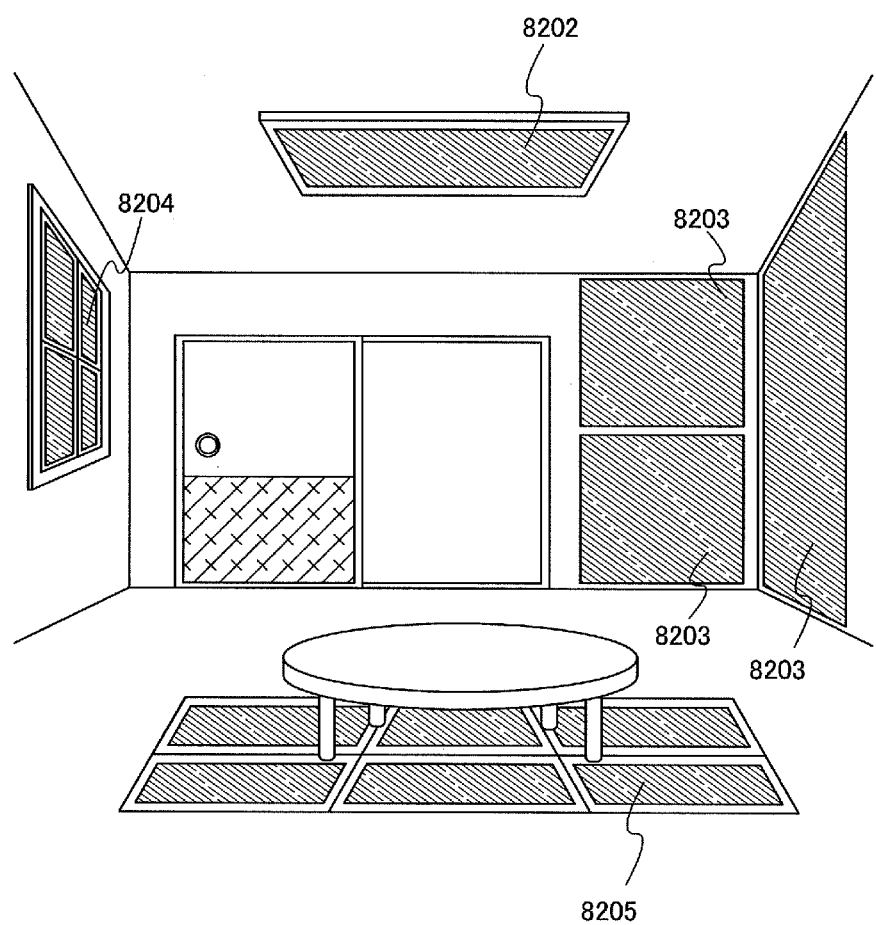
FIG. 9 is a diagram illustrating examples of application of a lighting device.

FIG. 9 illustrates an example in which the lighting device according to one embodiment of the present invention is used as an indoor lighting device. The lighting device according to one embodiment of the present invention can be used not only as a ceiling-mounted lighting device 8202 but also as a wall-mounted lighting device 8204 and a floor-mounted lighting device 8205. When the lighting device according to one embodiment of the present invention is used as the floor-mounted lighting device 8205, a second housing of the floor-mounted lighting device 8205 is loaded with the people and objects; therefore, a substrate and a sealing structure which can sustain the weight of the people and the objects which are loaded on the second housing of the floor-mounted lighting device 8205. In the case where a fragile glass substrate is used for the second housing of the floor-mounted lighting device 8205, the glass substrate may be protected by providing over the glass substrate a thick plastic plate which has a light-transmitting property and can sustain the weight of people and objects which are loaded thereon. Further, since the lighting device according to one embodiment of the present invention can be reduced in thickness and increased in size, it is also possible that a wall surface itself serves as a light source like lighting devices 8203 so that a room is illuminated.

The lighting device according to one embodiment of the present invention, which has a surface light source, is preferably used as an indoor lighting device because it has advantages such as a reduction in number of components such as a light-reflecting plate as compared with the case of using a point light source, or less heat generation as compared with a filament bulb. Further, the lighting device as a whole is thin and lightweight; thus, the lighting device can be mounted on a variety of places.

Figure 10:
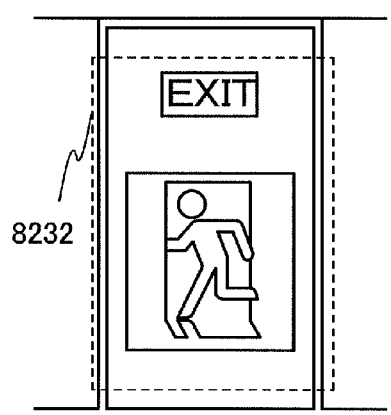
FIG. 10 is a diagram illustrating an example of application of a lighting device.

Next, an example in which the lighting device according to one embodiment of the present invention is applied to an emergency exit light is illustrated in FIG. 10.

FIG. 10 illustrates an example of the appearance of an emergency exit light. An emergency exit light 8232 can be formed by combination of the lighting device and a fluorescent plate provided with a fluorescent portion. Alternatively, the emergency exit light 8232 may be formed by combination of a lighting device which emits light of a specific color and a light-blocking plate provided with a transmissive portion with a shape illustrated in the drawing. The lighting device according to one embodiment of the present invention can emit light with a constant luminance, and thus is preferably used as an emergency exit light that needs to be on at all times.

The lighting device according to one embodiment of the present invention can be thin and lightweight and have a large area and high reliability.

Note that what is described in this embodiment with reference to each drawing can be freely combined with or replaced with what is described in any of the other embodiments as appropriate.

This application is based on Japanese Patent Application serial no. 2010-288677 filed with the Japan Patent Office on Dec. 24, 2010, the entire contents of which are hereby incorporated by reference.

What is claimed is:
1. A lighting device comprising:
plural stages of light-emitting element units;
a first wiring in contact with a first-stage light-emitting element unit of the plural stages of light-emitting element units; and
a second wiring in contact with a last-stage light-emitting element unit of the plural stages of light-emitting element units,
wherein the first-stage light-emitting element unit includes at least a first light-emitting element and a second light-emitting element which are connected in parallel,
wherein a light-emitting element unit adjacent to the first-stage light-emitting element unit includes at least a third light-emitting element and a fourth light-emitting element which are connected in parallel,
wherein the first light-emitting element, the second light-emitting element, the third light-emitting element, and the fourth light-emitting element each include a first electrode layer with a light-transmitting property, an organic compound-containing layer which is in contact with the first electrode layer, a second electrode layer with reflectivity which is in contact with the organic compound-containing layer, and an auxiliary wiring which is in contact with the first electrode layer and has a narrower width than the first wiring and the second wiring, wherein the second electrode layer of the first light-emitting element and the auxiliary wiring of the third light-emitting element are connected to each other, so that the first light-emitting element and the third light-emitting element are connected in series, wherein the second electrode layer of the second light-emitting element and the auxiliary wiring of the fourth light-emitting element are connected to each other, so that the second light-emitting element and the fourth light-emitting element are connected in series, wherein the auxiliary wiring of each of the light-emitting elements in the first-stage light-emitting element unit is in contact with the first wiring, and wherein the second electrode layer of each of the light-emitting elements in the last-stage light-emitting element unit is in contact with the second wiring.

2. The lighting device according to claim 1,
wherein a thickness of each of the first wiring and the second wiring is greater than or equal to 3 µm and less than or equal to 30 µm, and
wherein a thickness of the auxiliary wiring is greater than or equal to 0.1 µm and less than 3 µm.

3. The lighting device according to claim 1,
wherein the first wiring, the second wiring, and the auxiliary wiring each include a conductive layer containing copper.

4. The lighting device according to claim 1,
wherein each of the light-emitting elements includes an insulating layer which is over and in contact with the first electrode layer and has an opening, and
wherein the organic compound-containing layer is in contact with the first electrode layer in the opening.

5. The lighting device according to claim 1,
wherein first plural stages of light-emitting element units and second plural stages of light-emitting element units adjacent to the first plural stages of light-emitting element units are provided, and
wherein the first plural stages of light-emitting element units and the second plural stages of light-emitting element units are arranged axisymmetrically with respect to a length direction of the second wiring in a plan view.

6. The lighting device according to claim 1,
wherein the plural stages of light-emitting element units are provided over a substrate having an insulating surface,
wherein the substrate having an insulating surface has recessed portions in which the first wiring and the second wiring are provided in a plan view, and
wherein the first wiring and the second wiring are covered with a planarization film.

7. The lighting device according to claim 1,
wherein the organic compound-containing layer includes a layer containing a composite material in which an organic compound having a high hole transport property is mixed with an acceptor substance, and
wherein the layer containing the composite material is in contact with the second electrode layer.

8. A lighting device comprising:
plural stages of light-emitting element units connected in series;
a first wiring in contact with a first-stage light-emitting element unit of the plural stages of light-emitting element units; and
a second wiring in contact with a last-stage light-emitting element unit of the plural stages of light-emitting element units, wherein the first-stage light-emitting element unit includes at least a first light-emitting element and a second light-emitting element which are connected in parallel, wherein a light-emitting element unit adjacent to the first-stage light-emitting element unit includes at least a third light-emitting element and a fourth light-emitting element which are connected in parallel, wherein the first light-emitting element, the second light-emitting element, the third light-emitting element, and the fourth light-emitting element each include a first electrode layer with a light-transmitting property, an organic compound-containing layer which is in contact with the first electrode layer, a second electrode layer with reflectivity which is in contact with the organic compound-containing layer, a first auxiliary wiring which is in contact with the first electrode layer and has a narrower width than the first wiring and the second wiring, and a second auxiliary wiring which is in contact with the first electrode layer and has a narrower width than the first auxiliary wiring, wherein the second electrode layer of the first light-emitting element and the auxiliary wiring of the third light-emitting element are connected to each other, so that the first light-emitting element and the third light-emitting element are connected in series, wherein the second electrode layer of the second light-emitting element and the auxiliary wiring of the fourth light-emitting element are connected to each other, so that the second light-emitting element and the fourth light-emitting element are connected in series, wherein the first auxiliary wiring of each of the light-emitting elements in the first-stage light-emitting element unit is in contact with the first wiring, and wherein the second electrode layer of each of the light-emitting elements in the last-stage light-emitting element unit is in contact with the second wiring.

9. The lighting device according to claim 8,
wherein a thickness of each of the first wiring and the second wiring is greater than or equal to 3 µm and less than or equal to 30 µm,
wherein a thickness of the first auxiliary wiring is greater than or equal to 0.1 µm and less than 3 µm, and
wherein a thickness of the second auxiliary wiring is greater than or equal to 3 nm and less than or equal to 30 nm.

10. The lighting device according to claim 8,
wherein the first wiring, the second wiring, the first auxiliary wiring, and the second auxiliary wiring each include a conductive layer containing copper.

11. The lighting device according to claim 8,
wherein each of the light-emitting elements includes an insulating layer which is over and in contact with the first electrode layer and has an opening, and
wherein the organic compound-containing layer is in contact with the first electrode layer in the opening.

12. The lighting device according to claim 8,
wherein first plural stages of light-emitting element units and second plural stages of light-emitting element units adjacent to the first plural stages of light-emitting element units are provided, and
wherein the first plural stages of light-emitting element units and the second plural stages of light-emitting element units are arranged axisymmetrically with respect to a length direction of the second wiring in a plan view.

13. The lighting device according to claim 8,
wherein the organic compound-containing layer includes a layer containing a composite material in which an organic compound having a high hole transport property is mixed with an acceptor substance, and wherein the layer containing the composite material is in contact with the second electrode layer.

14. The lighting device according to claim 8, wherein the plural stages of light-emitting element units are provided over a substrate having an insulating surface, wherein the substrate having an insulating surface has recessed portions in which the first wiring and the second wiring are provided in a plan view, and wherein the first wiring and the second wiring are covered with a planarization film.

15. The lighting device according to claim 14, wherein light emitted from the first light-emitting element, the second light-emitting element, the third light-emitting element, and the fourth light-emitting element passes through the substrate having an insulating surface and is extracted.

* * * * *